(12) United States Patent
Sano et al.

(10) Patent No.: US 9,816,181 B2
(45) Date of Patent: Nov. 14, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Atsushi Sano, Toyama (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 112 days.

(21) Appl. No.: 14/591,544

(22) Filed: Jan. 7, 2015

(65) Prior Publication Data
US 2015/0200085 A1 Jul. 16, 2015

(30) Foreign Application Priority Data
Jan. 10, 2014 (JP) .................................. 2014-003756

(51) Int. Cl.
*C23C 16/36* (2006.01)
*C23C 16/30* (2006.01)
(Continued)

(52) U.S. Cl.
CPC .............. *C23C 16/36* (2013.01); *C23C 16/30* (2013.01); *C23C 16/45527* (2013.01); *C23C 16/45529* (2013.01); *C23C 16/45531* (2013.01); *C23C 16/45546* (2013.01); *H01L 21/0217* (2013.01); *H01L 21/0228* (2013.01); *H01L 21/02211* (2013.01)

(58) Field of Classification Search
CPC .... G06F 11/1048; G06F 3/064; G06F 3/0619; G06F 3/0679
See application file for complete search history.

(56) References Cited

U.S. PATENT DOCUMENTS 5,005,057 A 4/1991 Izumiya et al.
9,330,903 B2 * 5/2016 Sano ...................... H01L 21/022
(Continued)

FOREIGN PATENT DOCUMENTS

JP   H2-288371 A   11/1990
JP   03-229857 A   10/1991
(Continued)

OTHER PUBLICATIONS

Korean Notice of Preliminary Rejection, KR Application No. 10-2015-0002545, dated Dec. 1, 2015, 7 pgs. (English translation provided).
(Continued)

*Primary Examiner* — John P Dulka
(74) *Attorney, Agent, or Firm* — Volpe and Koenig, P.C.

(57) ABSTRACT

A method of manufacturing a semiconductor device, including forming a laminated film on a substrate by performing a cycle a first predetermined number of times. The cycle includes forming a first film which contains a predetermined element, boron, and nitrogen, and forming a second film which contains boron and nitrogen. A composition ratio of boron to nitrogen in the second film is different from that in the first film. The first film and the second film are laminated to form the laminated film.

16 Claims, 17 Drawing Sheets

(51) Int. Cl.
*C23C 16/455* (2006.01)
*H01L 21/02* (2006.01)

(56) References Cited

U.S. PATENT DOCUMENTS

| | | |
|---|---|---|
| 2010/0098884 A1 | 4/2010 | Balseanu et al. |
| 2013/0149873 A1* | 6/2013 | Hirose .................... H01L 21/31 438/763 |
| 2014/0273507 A1* | 9/2014 | Hirose .................... C23C 16/36 438/758 |
| 2014/0287597 A1* | 9/2014 | Hirose .................... C23C 16/30 438/786 |
| 2015/0200085 A1* | 7/2015 | Sano ........................ C23C 16/36 438/763 |

FOREIGN PATENT DOCUMENTS

| | | | |
|---|---|---|---|
| JP | 05-148625 A | | 6/1993 |
| JP | 09-095774 A | | 4/1997 |
| JP | 2004-136661 A | | 5/2004 |
| JP | 2012-531045 A | | 12/2012 |
| KR | 1020120093139 A | * | 8/2016 |

OTHER PUBLICATIONS

Japanese Office Action, JP Patent Application No. 2014-003756, Sep. 19, 2017, 4 pages (English translation provided).

* cited by examiner

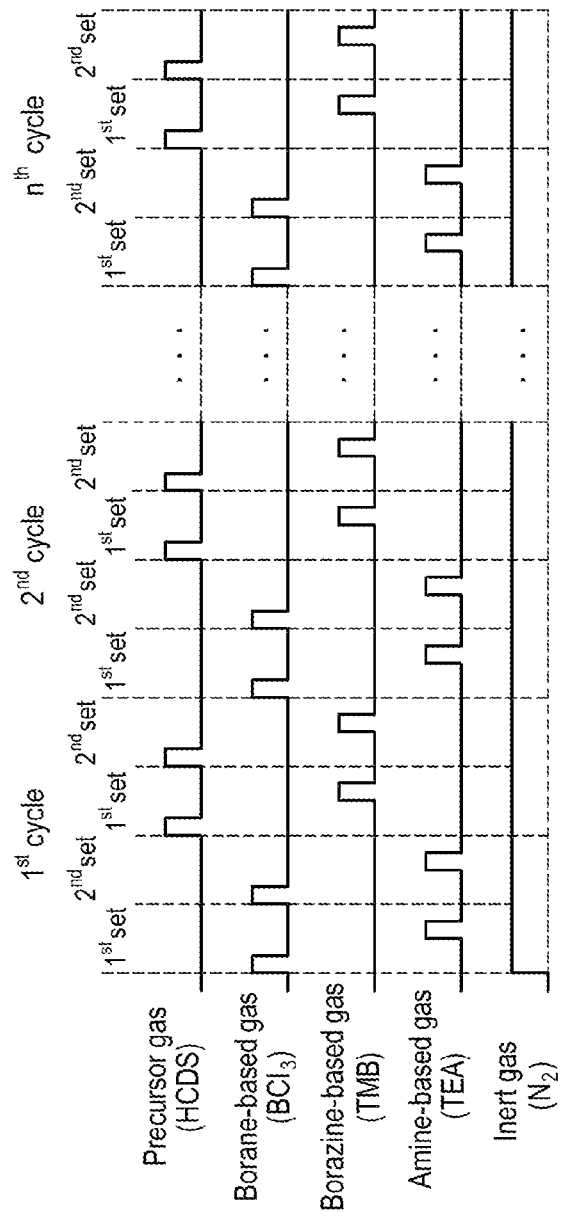

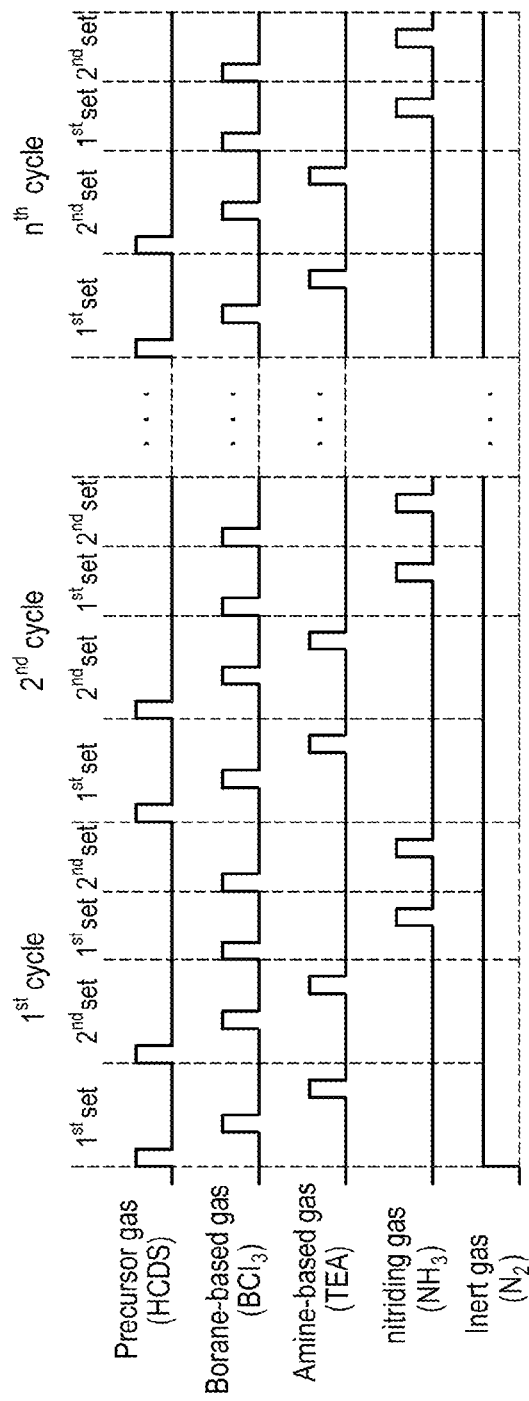

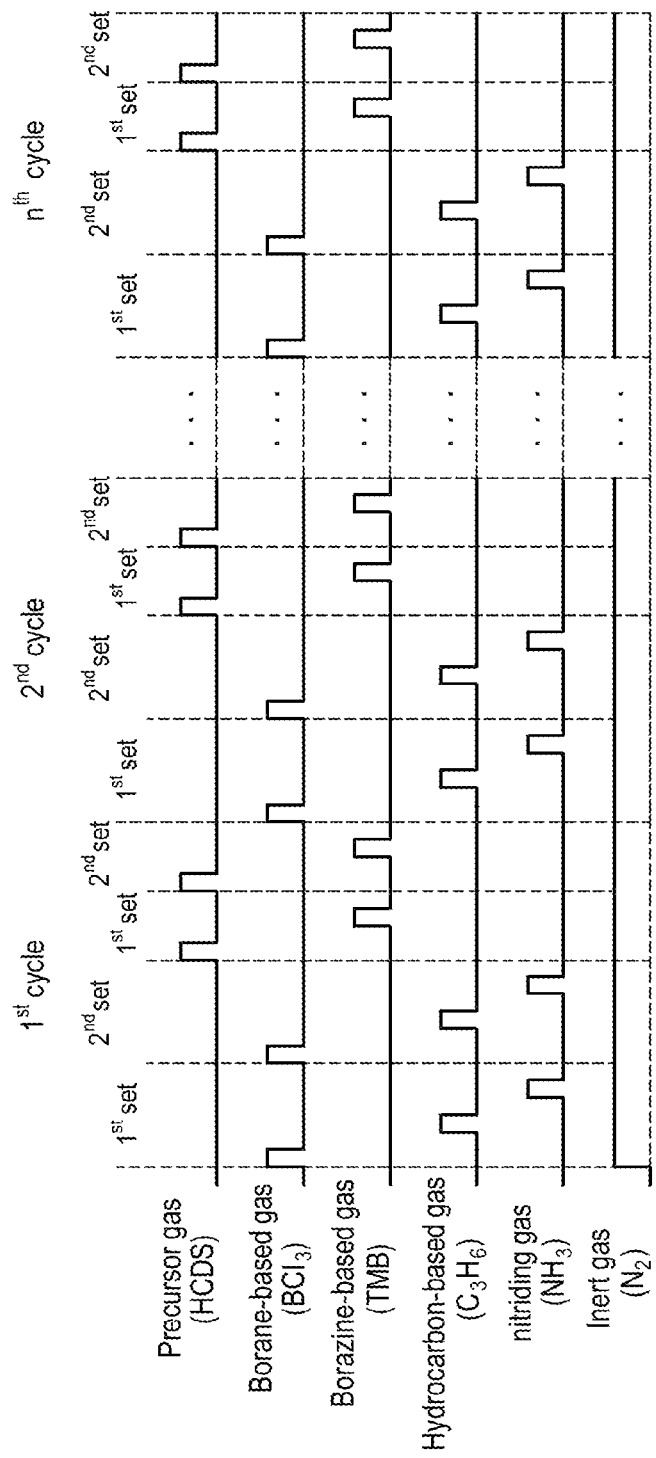

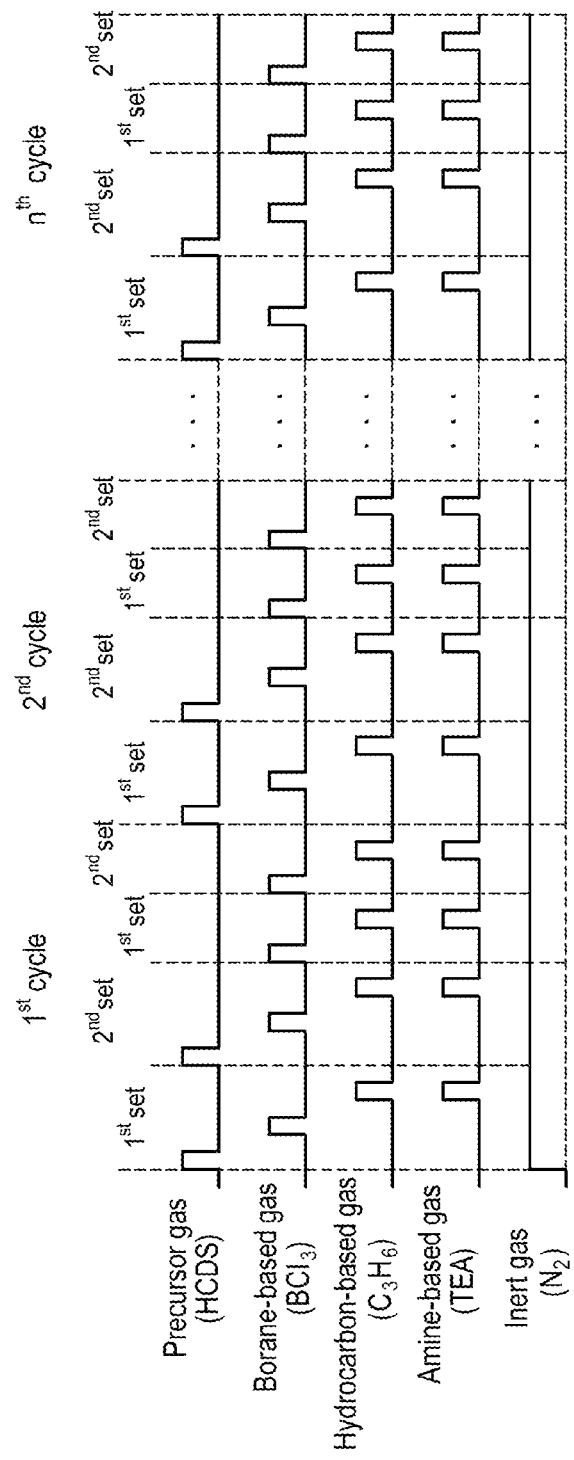

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2014-003756, filed on Jan. 10, 2014, the entire contents of which are incorporated herein by reference.

TECHNICAL FIELD

The present disclosure relates to a method of manufacturing a semiconductor device which includes a process of forming a thin film on a substrate, a substrate processing apparatus, and a recording medium.

BACKGROUND

As sizes of transistors decrease, a thin film such as an insulating film which constitutes a sidewall spacer (SWS) of a gate electrode or the like may require a decrease in film forming temperature, an improved resistance to hydrogen fluoride (HF), and a decrease in dielectric constant. To this end, it has been considered to use, as an insulating film, a silicon boronitride (SiBN) film obtained by adding boron (B) to a silicon nitride film (SiN film) or a silicon borocarbonitride (SiBCN) film obtained by adding boron (B) and carbon (C) to a silicon nitride film (SiN film).

Such an insulating film is often formed by an alternating supply method that alternately supplies several kinds of process gases because high step coverage characteristics are required. For example, using a silicon (Si)-containing gas as a silicon precursor, a boron-containing gas as a boron precursor, a carbon-containing gas as a carbon precursor, and a nitrogen-containing gas as a nitrogen precursor, a SiBCN film can be formed on a substrate by performing a predetermined number of times a cycle that sequentially supplies those process gases to the substrate. However, the aforementioned method has a limit in enhancing the controllability of a composition ratio and the controllability of a film property.

SUMMARY

The present disclosure provides some embodiments of a technique capable of enhancing the controllability of a composition ratio and the controllability of a film property when forming a film.

According to an embodiment of the present disclosure, there is provided a method of manufacturing a semiconductor device, including forming a laminated film on a substrate by performing a cycle a first predetermined number of times, the cycle including: forming a first film which contains a predetermined element, boron, and nitrogen; and forming a second film which contains boron and nitrogen, a composition ratio of boron to nitrogen in the second film being different from that in the first film, wherein the first film and the second film are laminated to form the laminated film.

BRIEF DESCRIPTION OF THE DRAWINGS

FIG. 4B is a view showing a second modification thereof.

FIGS. 5A and 5B are views respectively showing third and fourth modifications of the gas supply timing in the film forming sequence.

FIG. 12 is a view showing a twenty third modification of the gas supply timing in the film forming sequence.

FIG. 13 is a view showing a twenty fourth modification of the gas supply timing in the film forming sequence.

DETAILED DESCRIPTION

One Embodiment of the Present Disclosure

One embodiment of the present disclosure will now be described with reference to FIGS. 1 to 3.

(1) Configuration of Substrate Processing Apparatus

Figure 1:
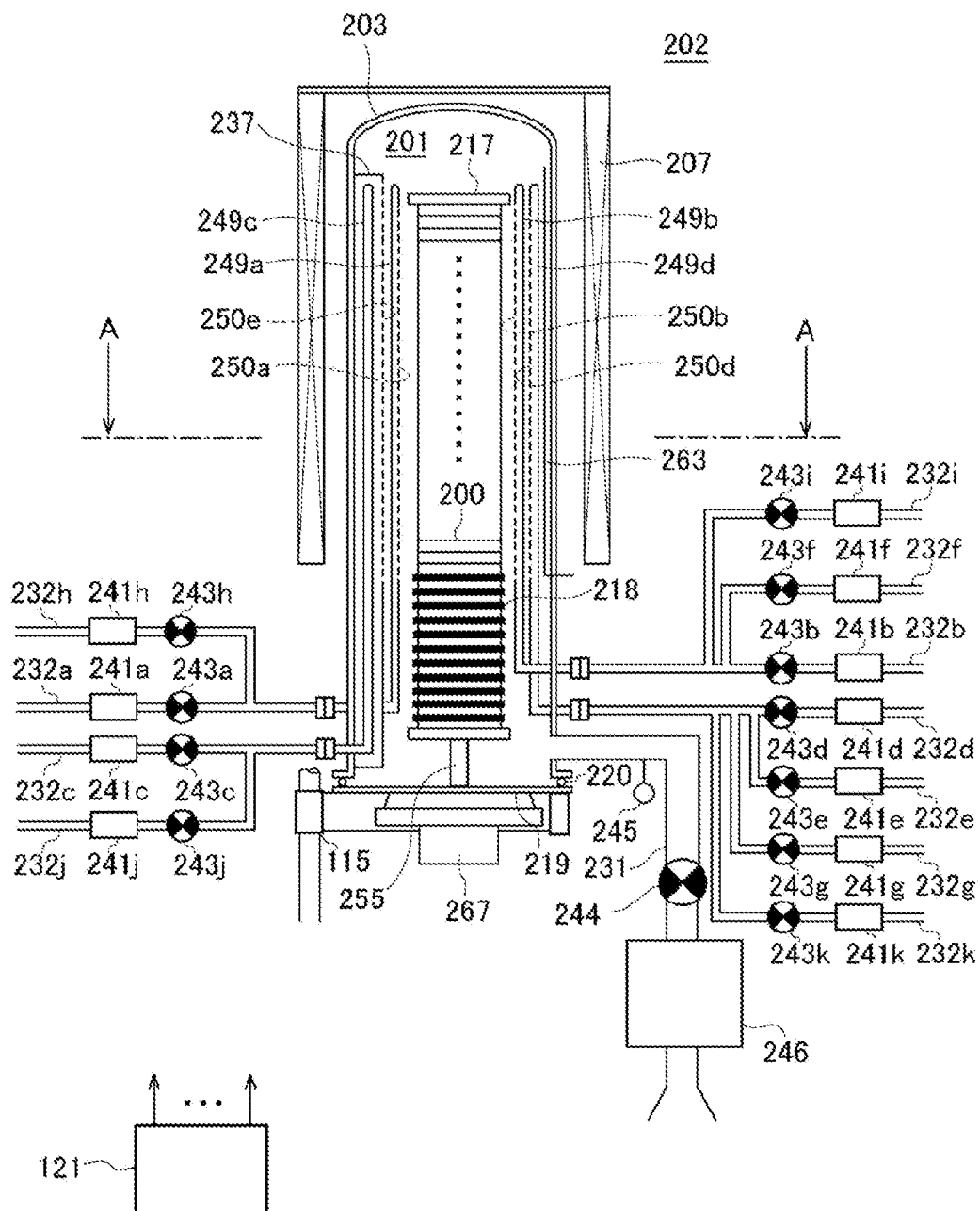
FIG. 1 is a schematic configuration view of a vertical processing furnace of a substrate processing apparatus according to one embodiment of the present disclosure, in which the processing furnace is shown in a longitudinal cross-sectional view.

As shown in FIG. 1, a processing furnace 202 includes a heater 207 as a heating unit (heating mechanism). The heater 207 has a cylindrical shape and is supported by a heater base (not shown) serving as a support plate so as to be vertically installed. As will be described later, the heater 207 functions as an activation mechanism (excitation unit) configured to thermally activate (excite) a gas.

A reaction tube 203 constituting a reaction vessel (process vessel) is disposed inside the heater 207 in a concentric from along with the heater 207. The reaction tube 203 is made of a heat resistant material such as quartz ($SiO_2$) or silicon carbide (SiC) and has a cylindrical shape with its upper end closed and its lower end opened. A process chamber 201 is formed in a hollow cylindrical portion of the reaction tube 203. The process chamber 201 is configured to accommodate a plurality of wafers 200 as substrates. The wafers 200 are horizontally stacked in multiple stages along a vertical direction in a boat 217 which will be described later.

Nozzles 249a to 249d are installed in the process chamber 201 to penetrate through a lower portion of the reaction tube 203. Gas supply pipes 232a to 232d are respectively connected to the nozzles 249a to 249d. A gas supply pipe 232f is connected to the gas supply pipe 232b. Gas supply pipes 232e and 232g are respectively connected to the gas supply pipe 232d. In this way, the four nozzles 249a to 249d and the seven gas supply pipes 232a to 232g are installed in the reaction tube 203 and are configured to supply plural kinds of gases, e.g., seven kinds of gases in this embodiment, into the process chamber 201.

However, the processing furnace 202 of the present embodiment is not limited to the above-described configuration. For example, a manifold (not shown) made of metal and configured to support the reaction tube 203 may be installed under the reaction tube 203 such that respective nozzles may be installed to penetrate through a sidewall of the manifold. In this case, an exhaust pipe 231 described later may be further installed at the manifold. In addition, even in this case, the exhaust pipe 231 may be installed at a lower portion of the reaction tube 203 rather than at the manifold. A furnace port of the processing furnace 202 may be formed of metal and the nozzles or the like may be installed at the metal furnace port.

Mass flow controllers (MFC) 241a to 241g, which are flow rate controllers (flow rate control units), and valves 243a to 243g, which are opening/closing valves, are installed in the gas supply pipes 232a to 232g in this order from an upstream side, respectively. Gas supply pipes 232h to 232k configured to supply an inert gas are connected to the gas supply pipes 232a to 232d at downstream sides of the valves 243a to 243d, respectively. Mass flow controllers (MFC) 241h to 241k, which are flow rate controllers (flow rate control parts), and valves 243h to 243k, which are opening/closing valves, are installed in the gas supply pipes 232h to 232k in this order from the upstream side, respectively.

The above-described nozzles 249a, 249b and 249d are respectively connected to leading ends of the gas supply pipes 232a, 232b and 232d. As shown in FIG. 2, the respective nozzles 249a, 249b and 249d are disposed in an annular space between an inner wall of the reaction tube 203 and the wafers 200 and are vertically installed so as to extend upward along a stacking direction of the wafers 200 from the lower portion of the inner wall of the reaction tube 203 to the upper portion thereof. That is to say, the nozzles 249a, 249b and 249d are installed in a region, which exists at a lateral side of a wafer arrangement region where the wafers 200 are arranged and which horizontally surrounds the wafer arrangement region, so as to extend along the wafer arrangement region. Each of the nozzles 249a, 249b and 249d is configured as an L-shaped long nozzle. A horizontal portion of each of the nozzles 249a, 249b and 249d is installed so as to penetrate through a lower sidewall of the reaction tube 203. A vertical portion of each of the nozzles 249a, 249b and 249d is installed so as to extend upward at least from one end portion of the wafer arrangement region toward the other end portion thereof. A plurality of gas supply holes 250a, 250b and 250d, through which gases are supplied, are respectively formed on side surfaces of the nozzles 249a, 249b and 249d. The gas supply holes 250a, 250b and 250d are respectively opened toward the center of the reaction tube 203 to enable gases to be supplied toward the wafers 200. A plurality of the gas supply holes 250a, 250b and 250d are formed over a region spanning from the lower portion of the reaction tube 203 to the upper portion thereof. The respective gas supply holes 250a, 250b and 250d have the same opening area and are formed at a predetermined opening pitch.

A nozzle 249c is connected to a leading end of the gas supply pipe 232c. The nozzle 249c is installed within a buffer chamber 237 which serves as a gas dispersion space. The buffer chamber 237 is installed in an annular space between the inner wall of the reaction tube 203 and the wafers 200 spanning from the lower portion of the inner wall of the reaction tube 203 to the upper portion thereof, so as to extend along the stacking direction of the wafers 200. That is to say, the buffer chamber 237 is installed in a region, which exists at a lateral side of the wafer arrangement region and which horizontally surrounds the wafer arrangement region, so as to extend along the wafer arrangement region. Gas supply holes 250e, through which gases are supplied, are formed at an end portion of a wall of the buffer chamber 237 adjoining the wafers 200. The gas supply holes 250e are opened toward the center of the reaction tube 203 so that the gases can be supplied toward the wafers 200. A plurality of gas supply holes 250e are formed over a region spanning from the lower portion of the reaction tube 203 to the upper portion thereof. The respective gas supply holes 250e have the same opening area and are formed at a predetermined opening pitch.

The nozzle 249c is installed in an end portion of the buffer chamber 237 opposite to the end portion thereof in which the gas supply holes 250e are formed, so as to extend upward along the stacking direction of the wafers 200 from the lower portion of the inner wall of the reaction tube 203 to the upper portion thereof. That is to say, the nozzles 249c is installed in a region, which exists at the lateral side of the wafer arrangement region where the wafers 200 are arranged and which horizontally surrounds the wafer arrangement region, so as to extend along the wafer arrangement region. The nozzle 249c is configured as an L-shaped long nozzle. A horizontal portion of the nozzle 249c is installed so as to penetrate through a lower sidewall of the reaction tube 203. A vertical portion of the nozzle 249c is installed so as to extend upward at least from one end portion of the wafer arrangement region toward the other end portion thereof. Gas supply holes 250c, through which gases are supplied, are formed on a side surface of the nozzle 249c. The gas supply holes 250c are opened toward the center of the reaction tube 203. Similar to the gas supply holes 250e, a plurality of gas supply holes 250c are formed over a region spanning from the lower portion of the reaction tube 203 to the upper portion thereof. When a pressure difference between an interior of the buffer chamber 237 and an interior of the process chamber 201 is small, the gas supply holes 250c may be configured to have a constant opening area and a constant opening pitch from an upstream side (i.e., a lower portion) to a downstream side (i.e., an upper portion). In contrast, when the pressure difference is large, the opening area may become gradually larger and the opening pitch may become gradually smaller from the upstream side toward the downstream side.

By adjusting the opening area or the opening pitch of the respective gas supply holes 250c from the upstream side to the downstream side as described above, gases may be ejected from the respective gas supply holes 250c substantially at the same flow rate despite a flow velocity difference. The gas that flows out from the individual gas supply holes 250c is first introduced into the buffer chamber 237. This makes it possible to make the flow velocity of the gases within the buffer chamber 237 uniform. The particle velocity of the gases ejected from the respective gas supply holes 250c into the buffer chamber 237 are reduced in the buffer chamber 237. Then the gases are ejected from the respective gas supply holes 250e into the process chamber 201. The gases ejected from the respective gas supply holes 250c into the buffer chamber 237 have a uniform flow rate and flow velocity when ejected from the respective gas supply holes 250e into the process chamber 201.

As described above, in the present embodiment, the gas is transferred through the nozzles 249a to 249d and the buffer chamber 237 disposed in an annular vertically-elongated space, i.e., a cylindrical space, defined by the inner wall of the reaction tube 203 and the end portions of the stacked wafers 200. The gas is initially ejected into the reaction tube 203 near the wafers 200 through the gas supply holes 250a to 250e formed in the nozzles 249a to 249d and the buffer chamber 237, respectively. Then, a main flow of the gas within the reaction tube 203 is oriented in a direction parallel to surfaces of the wafers 200, i.e., a horizontal direction. With this configuration, the gas can be uniformly supplied to the respective wafers 200. This makes it possible to enhance the uniformity of a thickness of a thin film formed on each of the wafers 200. The gas flowing on the surfaces of the wafers 200, i.e., the reacted residual gas, flows toward an exhaust port, i.e., the exhaust pipe 231. The flow direction of the residual gas is not limited to a vertical direction but may be appropriately decided depending on a position of the exhaust port.

A precursor gas containing a specified element, e.g., a halosilane precursor gas containing Si as a specified element and a halogen element, is supplied from the gas supply pipe 232a into the process chamber 201 through the MFC 241a, the valve 243a and the nozzle 249a.

The halosilane precursor gas refers to a halosilane precursor remaining in a gaseous state, e.g., a gas obtained by vaporizing a halosilane precursor remaining in a liquid state under a normal temperature and a normal pressure, a halosilane precursor remaining in a gaseous state under a normal temperature and a normal pressure, or the like. The halosilane precursor is a silane precursor having a halogen group. The halogen group includes a chloro group, a fluoro group and a bromo group. That is to say, the halogen group includes a halogen element such as chlorine (Cl), fluorine (F), bromine (Br) or the like. That is, here, the halosilane precursor may refer to one kind of halide. The term "precursor" used herein means a "liquid precursor in a liquid state", or a "precursor gas in a gaseous state", or both.

As the halosilane precursor gas, e.g., a precursor gas containing Si and Cl, namely a chlorosilane precursor gas may be used. As the chlorosilane precursor gas, e.g., a hexachlorodisilane ($Si_2Cl_6$, abbreviation: HCDS) gas may be used. In the case of using a liquid precursor, such as HCDS or the like, which remains in a liquid state under a normal temperature and a normal pressure, the liquid precursor is vaporized by a vaporization system such as a vaporizer, a bubbler or the like and is supplied as a precursor gas (HCDS gas).

As a boron-containing gas, e.g., a borane-based gas, is supplied from the gas supply pipe 232b into the process chamber 201 through the MFC 241b, the valve 243b and the nozzle 249b.

The borane-based gas refers to a borane compound remaining in a gaseous state, e.g., a gas obtained by vaporizing a borane compound remaining in a liquid state under a normal temperature and a normal pressure, a borane compound remaining in a gaseous state under a normal temperature and a normal pressure, or the like. The borane compound includes a haloborane compound containing B and a halogen element, e.g., a chloroborane compound containing B and Cl. Furthermore, the borane compound includes borane (borohydride) such as monoborane ($BH_3$), diborane ($B_2H_6$) or the like, and any type of borane compound (borane derivative) in which H atoms of borane are substituted with other elements. The borane-based gas acts as a B source in a substrate processing process to be described later. As the borane-based gas, e.g., a trichloroborane ($BCl_3$) gas may be used. The $BCl_3$ gas is a boron-containing gas which does not contain a borazine compound to be described later, namely a boron-containing gas which does not include a borazine ring skeleton (or non-borazine-based boron-containing gas).

A boron-containing gas, e.g., a gas including a borazine ring skeleton, is supplied from the gas supply pipe 232f into the process chamber 201 through the MFC 241f, the valve 243f, the gas supply pipe 232b and the nozzle 249b.

As the gas including a borazine ring skeleton, a gas including a borazine ring skeleton and an organic ligand, namely an organic borazine-based gas may be used. As the organic borazine-based gas, e.g., a gas containing an alkylborazine compound which is an organic borazine compound may be used. The organic borazine-based gas may be referred to as a borazine compound gas or a borazine-based gas.

Figure 14A:
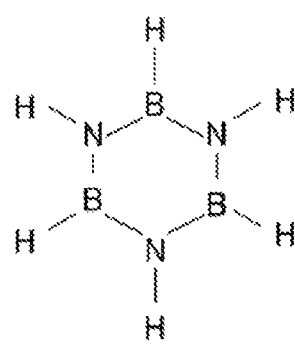
FIG. 14A is a view showing a chemical structural formula of borazine.
Figure 14C:
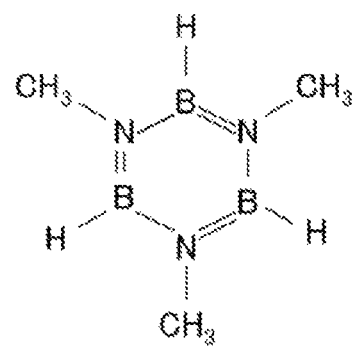
FIG. 14C is a view showing a chemical structural formula of n,n',n"-trimethylborazine.
Figure 14B:
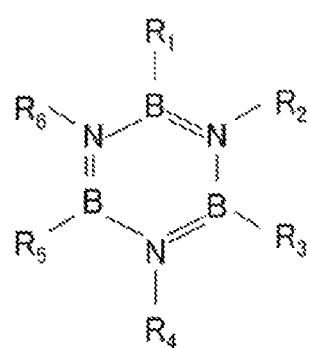
FIG. 14B is a view showing a chemical structural formula of a borazine compound.

In this regard, borazine is a heterocyclic compound composed of three elements, boron (B), nitrogen (N), and hydrogen (H). Borazine may be represented by a composition formula of $B_3H_6N_3$ and may be represented by a chemical structural formula shown in FIG. 14A. A borazine compound is a compound which includes a borazine ring skeleton (also referred to as a "borazine skeleton") constituting a borazine ring including three B atoms and three N atoms. The organic borazine compound is a borazine compound containing carbon (C) and may also be referred to as a borazine compound containing a C-containing ligand, namely an organic ligand. The alkylborazine compound is a borazine compound containing an alkyl group and may be referred to as a borazine compound containing an alkyl group as an organic ligand. The alkylborazine compound is a compound in which at least one of six hydrogen (H) atoms contained in borazine is substituted with a hydrocarbon containing one or more C atoms, and may be represented by a chemical structural formula shown in FIG. 14B. In this case, each of $R_1$ to $R_6$ in the chemical structural formula shown in FIG. 14B is a H atom or an alkyl group containing one to four C atoms. $R_1$ to $R_6$ may be the same kind of alkyl group or may be different kinds of alkyl groups. However, not all of $R_1$ to $R_6$ is H. The alkylborazine compound may refer to a substance which has a borazine g skeleton constituting a borazine ring and which contains B, N, H, and C. Moreover, the alkylborazine compound may refer to a substance having a borazine ring skeleton and containing an alkyl ligand. In addition, each of $R_1$ to $R_6$ may be an H atom, or an alkenyl group or an alkynyl group containing one to four C atoms. $R_1$ to $R_6$ may be the same kind of alkenyl group or alkynyl group, or may be different kinds of alkenyl groups or alkynyl groups. However, not all of $R_1$ to $R_6$ is H.

The borane-based gas acts as a B source, an N source and a C source in a substrate processing process to be described later. That is to say, the borane-based gas may be referred to as a boron-containing gas and may also be referred to as an N- and C-containing gas.

Figure 14D:
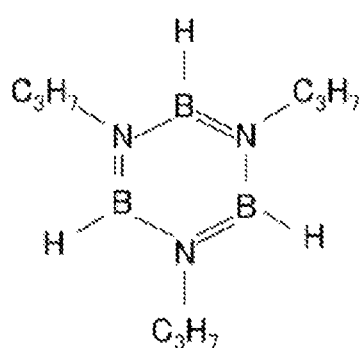
FIG. 14D is a view showing a chemical structural formula of n,n',n"-tri-n-propylborazine.

As the borane-based gas, it may be possible to use, e.g., an n, n', n"-trimethylborazine (abbreviation: TMB) gas, an n, n', n"-triethylborazine (abbreviation: TEB) gas, an n, n', n"-tri-n-propylborazine (abbreviation: TPB) gas, an n, n', n"-triisopropylborazine (abbreviation: TIPB) gas, an n, n', n"-tri-n-butylborazine (abbreviation: TBB) gas, an n, n', n"-triisobutylborazine (abbreviation: TIBB) gas, or the like. The TMB is a borazine compound in which $R_1$, $R_3$, and $R_5$ of the chemical structural formula shown in FIG. 14B are H atoms while $R_2$, $R_4$, and $R_6$ of the chemical structural formula are methyl groups. The TMB may be represented by a chemical structural formula shown in FIG. 14C. The TEB is a borazine compound in which $R_1$, $R_3$, and $R_5$ of the chemical structural formula shown in FIG. 14B are H atoms while $R_2$, $R_4$, and $R_6$ of the chemical structural formula are ethyl groups. The TPB is a borazine compound in which $R_1$, $R_3$, and $R_5$ of the chemical structural formula shown in FIG. 14B are H atoms while $R_2$, $R_4$, and $R_6$ of the chemical structural formula are propyl groups. The TPB may be represented by a chemical structural formula shown in FIG. 14D. The TIPB is a borazine compound in which $R_1$, $R_3$, and $R_5$ of the chemical structural formula shown in FIG. 14B are H atoms while $R_2$, $R_4$, and $R_6$ of the chemical structural formula are isopropyl groups. The TIBB is a borazine compound in which $R_1$, $R_3$, and $R_5$ of the chemical structural formula shown in FIG. 14B are H atoms while $R_2$, $R_4$, and $R_6$ of the chemical structural formula are isobutyl groups.

In the case of using a borazine compound such as TMB or the like which remains in a liquid state under a normal temperature and a normal pressure, the borazine compound in a liquid state is vaporized by a vaporization system such as a vaporizer or a bubbler and is supplied as a borane-based gas (e.g., a TMB gas).

A nitrogen-containing gas, e.g., a hydrogen nitride-based gas, is supplied from the gas supply pipe 232c into the process chamber 201 through the MFC 241c, the valve 243c, the nozzle 249c and the buffer chamber 237. The hydrogen nitride-based gas acts as a nitrogen gas, namely an N source, in a substrate processing process to be described later. As the hydrogen nitride-based gas, e.g., an ammonia ($NH_3$) gas may be used.

An N- and C-containing gas, e.g., an amine-based gas, is supplied from the gas supply pipes 232d and 232e into the process chamber 201 through the MFCs 241d and 241e, the valves 243d and 243e and the nozzle 249d.

The amine-based gas is gaseous amine, e.g., a gas which is obtained by vaporizing amine remaining in a liquid state under a normal temperature and a normal pressure or a gas which contains an amine group such as amine or the like remaining in a gaseous state under a normal temperature and a normal pressure. The amine-based gas contains amine such as ethylamine, methylamine, propylamine, isopropylamine, butylamine, isobutylamine, or the like. As used herein, the term "amine" is a generic name of compounds in which a hydrogen atom in ammonia ($NH_3$) is substituted with a hydrocarbon group such as an alkyl group or the like. Amine contains a hydrocarbon group such as an alkyl group or the like as a ligand containing C atoms, namely an organic ligand. Since the amine-based gas contains three elements C, N, and H while not containing Si, it may be referred to as a Si-free gas. Since the amine-based gas does not contain Si and metal, it may be referred to as a Si-free and metal-free gas. The amine-based gas may be a substance consisting of only three elements C, N and H. The amine-based gas acts as a N source and as a C source in a substrate processing process to be described later. The term "amine" used herein means "amine remaining in a liquid state", an "amine-based gas remaining in a gaseous state", or both.

As the amine-based gas, it may be possible to use, e.g., a triethylamine (($C_2H_5)_3N$, abbreviation: TEA) gas or a diethylamine ($C_2H_5)_2NH$, abbreviation: DEA) gas in which the number of C-containing ligands (ethyl groups) in the chemical structural formula (in one molecule) is multiple and in which the number of C atoms in one molecule is larger than the number of N atoms. In the case of using amine such as TEA, DEA or the like which remains in a liquid state under a normal temperature and a normal pressure, the amine in a liquid state is vaporized by a vaporization system such as a vaporizer or a bubbler and is supplied as an N- and C-containing gas (e.g., a TEA gas or a DEA gas).

A carbon-containing gas, e.g., a hydrocarbon-based gas, is supplied from the gas supply pipe 232g into the process chamber 201 through the MFC 241g, the valve 243g, the gas supply pipe 232d and the nozzle 249d. The hydrocarbon-based gas may be a substance consisting of only two elements C and H. The hydrocarbon-based gas acts as a C source in a substrate processing process to be described later. As the hydrocarbon-based gas, it may be possible to use, e.g., a propylene ($C_3H_6$) gas.

An inert gas, e.g., a nitrogen ($N_2$) gas, is supplied from the gas supply pipes 232h to 232k into the process chamber 201 through the MFCs 241h to 241k, the valves 243h to 243k, the gas supply pipes 232a to 232d, the nozzles 249a to 249d and the buffer chamber 237.

In the case of supplying the aforementioned gases from the respective gas supply pipes, a precursor gas supply system for supplying a precursor gas containing a specified element is mainly configured by the gas supply pipe 232a, the MFC 241a and the valve 243a. The nozzle 249a may be included in the precursor gas supply system. The precursor gas supply system may be referred to as a precursor supply system. In the case of supplying a halosilane precursor gas from the gas supply pipe 232a, the precursor gas supply system may be referred to as a halosilane precursor gas supply system or a halosilane precursor supply system.

A boron-containing gas supply system for supplying a boron-containing gas is mainly configured by the gas supply pipes 232b and 232f, the MFCs 241b and 241f and the valves 243b and 243f. The nozzle 249b may be included in the boron-containing gas supply system. The boron-containing gas supply system may be referred to as a boron-based gas supply system or a boron compound supply system.

In the case of supplying a borane-based gas from the gas supply pipe 232b, the gas supply system mainly configured by the gas supply pipe 232b, the MFC 241b and the valve 243b may be referred to as a borane-based gas supply system. The nozzle 249b may be included in the borane-based gas supply system. The borane-based gas supply system may be referred to as a borane compound supply system.

In the case of supplying a borazine-based gas from the gas supply pipe 232f, the gas supply system mainly configured by the gas supply pipe 232f, the MFC 241f and the valve 243f may be referred to as a borazine-based gas supply system. The nozzle 249b existing at the downstream side of the connection portion of the gas supply pipe 232b and the gas supply pipe 232f may be included in the borazine-based gas supply system. The borazine-based gas supply system may be referred to as an organic borazine-based gas supply system or a borazine compound supply system. As described above, similar to the amine-based gas or the like, the borazine-based gas is a gas which contains N and C. Thus, the borazine-based gas supply system may be included in the below-described gas supply system which contains nitrogen and carbon.

A nitrogen-containing gas supply system which supplies a nitrogen-containing gas is mainly configured by the gas supply pipe 232c, the MFC 241c and the valve 243c. The nozzle 249c and the buffer chamber 237 may be included in the nitrogen-containing gas supply system. The nitrogen-containing gas supply system may be referred to as a nitriding gas supply system or a nitriding agent supply system. In the case of supplying a hydrogen nitride-based gas from the gas supply pipe 232c, the nitrogen-containing gas supply system may be referred to as a hydrogen nitride-based gas supply system or a hydrogen nitride supply system.

A nitrogen/carbon-containing gas supply system which supplies an N- and C-containing gas is mainly configured by the gas supply pipes 232d and 232e, the MFCs 241d and 241e and the valves 243d and 243e. The nozzle 249d may be included in the nitrogen/carbon-containing gas supply system. In the case of supplying an amine-based gas from the gas supply pipes 232d and 232e, the nitrogen/carbon-containing gas supply system may be referred to as an amine-based gas supply system or an amine supply system. Since the N- and C-containing gas is a nitrogen-containing gas, the nitrogen/carbon-containing gas supply system may be included in the nitrogen-containing gas supply system.

A carbon-containing gas supply system which supplies a carbon-containing gas is mainly configured by the gas supply pipe 232g, the MFC 241g and the valve 243g. The nozzle 249d existing at the downstream side of a connection portion where the gas supply pipe 232d is connected to the gas supply pipe 232g may be included in the carbon-containing gas supply system. In the case of supplying a hydrocarbon-based gas from the gas supply pipe 232g, the carbon-containing gas supply system may be referred to as a hydrocarbon-based gas supply system or a hydrocarbon supply system.

An inert gas supply system is mainly configured by the gas supply pipes 232h to 232k, the MFCs 241h to 241k and the valves 243h to 243k. The inert gas supply system may be referred to as a purge gas supply system or a carrier gas supply system.

Figure 2:
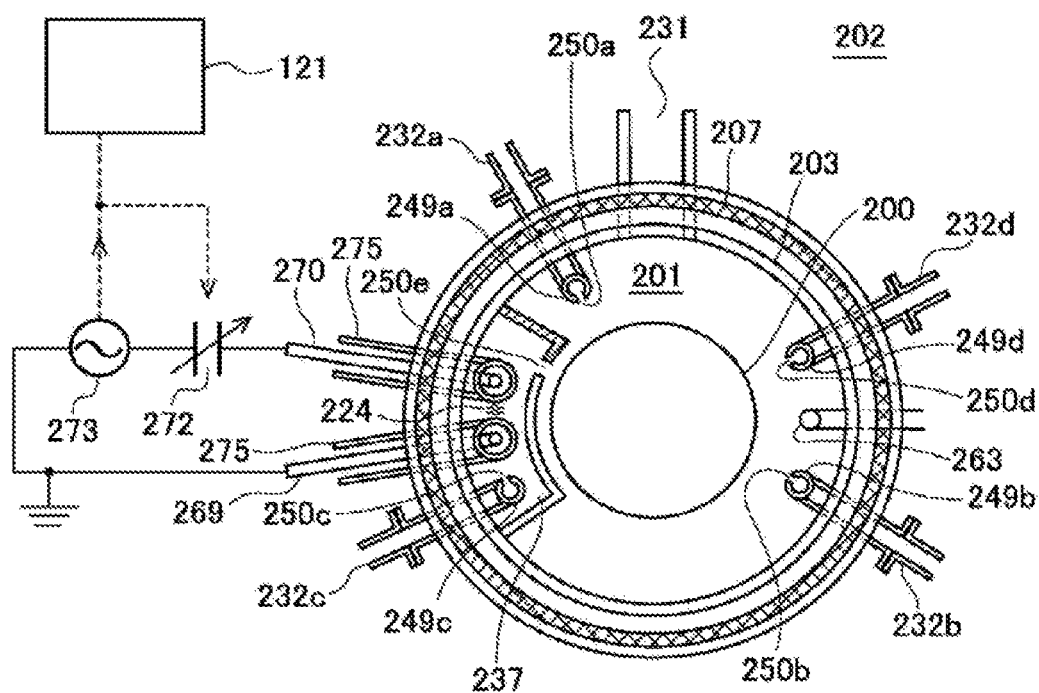
FIG. 2 is a schematic configuration view of the vertical processing furnace of the substrate processing apparatus according to one embodiment of the present disclosure, in which the processing furnace is shown in a cross-sectional view taken along line A-A in FIG. 1.

In the buffer chamber 237, as illustrated in FIG. 2, two rod-shaped electrodes 269 and 270, which are made of a conductor and which have an elongated structure, are disposed along the stacking direction of the wafers 200 so as to span from a lower portion of the reaction tube 203 to an upper portion thereof. Each of the rod-shaped electrodes 269 and 270 is disposed parallel to the nozzle 249c. Each of the rod-shaped electrodes 269 and 270 is covered with and protected by an electrode protection tube 275 over a region spanning from an upper portion to a lower portion thereof. One of the rod-shaped electrodes 269 and 270 is connected to a high-frequency power source 273 via a matcher 272, and the other is connected to a ground corresponding to a reference electric potential. By applying high-frequency power from the high-frequency power source 273 between the rod-shaped electrodes 269 and 270 via the matcher 272, plasma is generated in a plasma generation region 224 between the rod-shaped electrodes 269 and 270. A plasma source as a plasma generator (plasma generating part) is mainly configured by the rod-shaped electrodes 269 and 270 and the electrode protection tube 275. The matcher 272 and the high-frequency power source 273 may also be included in the plasma source. As will be described later, the plasma source functions as an activating mechanism (exciting unit) that activates (excites) a gas into a plasma state.

The electrode protection tube 275 has a structure that each of the rod-shaped electrodes 269 and 270 can be inserted into the buffer chamber 237 while keeping each of the rod-shaped electrodes 269 and 270 isolated from an internal atmosphere of the buffer chamber 237. If an internal oxygen concentration of the electrode protection tube 275 is substantially equal to an oxygen concentration in ambient air (atmosphere), each of the rod-shaped electrodes 269 and 270 inserted into the electrode protection tube 275 may be oxidized by the heat generated from the heater 207. By charging the inside of the electrode protection tube 275 with an inert gas such as a nitrogen gas or the like, or by purging the inside of the electrode protection tube 275 with an inert gas such as a nitrogen gas or the like through the use of an inert gas purging mechanism, it is possible to reduce the internal oxygen concentration of the electrode protection tube 275, thereby preventing oxidation of the rod-shaped electrodes 269 and 270.

The exhaust pipe 231 for exhausting an internal atmosphere of the process chamber 201 is installed in the reaction tube 203. A vacuum exhaust device, for example, a vacuum pump 246, is connected to the exhaust pipe 231 via a pressure sensor 245, which is a pressure detector (pressure detecting part) for detecting an internal pressure of the process chamber 201, and an auto pressure controller (APC) valve 244, which is a pressure regulator (pressure regulating unit). The APC valve 244 is configured to perform/stop vacuum exhaust in the process chamber 201 by opening/closing the valve with the vacuum pump 246 actuated. Further, the APC valve 244 is configured to regulate the internal pressure of the process chamber 201 by adjusting an opening degree of the valve pursuant to the pressure information detected by the pressure sensor 245 while keeping the vacuum pump 246 actuated. An exhaust system is mainly configured by the exhaust pipe 231, the APC valve 244, and the pressure sensor 245. The vacuum pump 246 may be included in the exhaust system.

A seal cap 219, which serves as a furnace port cover configured to hermetically seal a lower end opening of the reaction tube 203, is installed under the reaction tube 203. The seal cap 219 is configured to make contact with the lower end of the reaction tube 203 at the lower side in the vertical direction. The seal cap 219 is made of metal such as, e.g., stainless steel or the like, and is formed into a disc shape. An O-ring 220, which is a seal member making contact with the lower end portion of the reaction tube 203, is installed on an upper surface of the seal cap 219. A rotary mechanism 267 configured to rotate a boat 217 to be described later is installed at the opposite side of the seal cap 219 from the process chamber 201. A rotary shaft 255 of the rotary mechanism 267, which passes through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 115 is configured to load and unload the boat 217 into and from the process chamber 201 by moving the seal cap 219 up and down. That is to say, the boat elevator 115 is configured as a transfer device (transfer mechanism) that transfers the boat 217, i.e., the wafers 200, into and out of the process chamber 201.

The boat 217 as a substrate support is configured to support a plurality of, e.g., 25 to 200, wafers 200 in a horizontal posture and at multiple stages by vertically arranging the wafers 200 with the centers of the wafers 200 aligned with one another. That is to say, the boat 217 is configured to arrange the wafers 200 in a spaced-apart relationship. The boat 217 is made of a heat resistant material such as quartz or silicon carbide. Heat insulating plates 218 made of a heat resistant material such as quartz or silicon carbide are installed below the boat 217 in a horizontal posture and at multiple stages. With this configuration, the heat generated from the heater 207 is hardly transferred to the seal cap 219. However, the present embodiment is not limited to the aforementioned embodiment. For example, instead of installing the heat insulating plates 218 below the boat 217, a heat insulating tube as a tubular member made of a heat resistant material such as quartz or silicon carbide may be installed below the boat 217.

A temperature sensor 263, which is a temperature detector, is installed in the reaction tube 203. Based on temperature information detected by the temperature sensor 263, the state of power being supplied to the heater 207 is adjusted such that the interior of the process chamber 201 has a desired temperature distribution. Similar to the nozzles 249a to 249d, the temperature sensor 263 is configured to have an L-like shape. The temperature sensor 263 is installed along the inner wall of the reaction tube 203.

Figure 3:
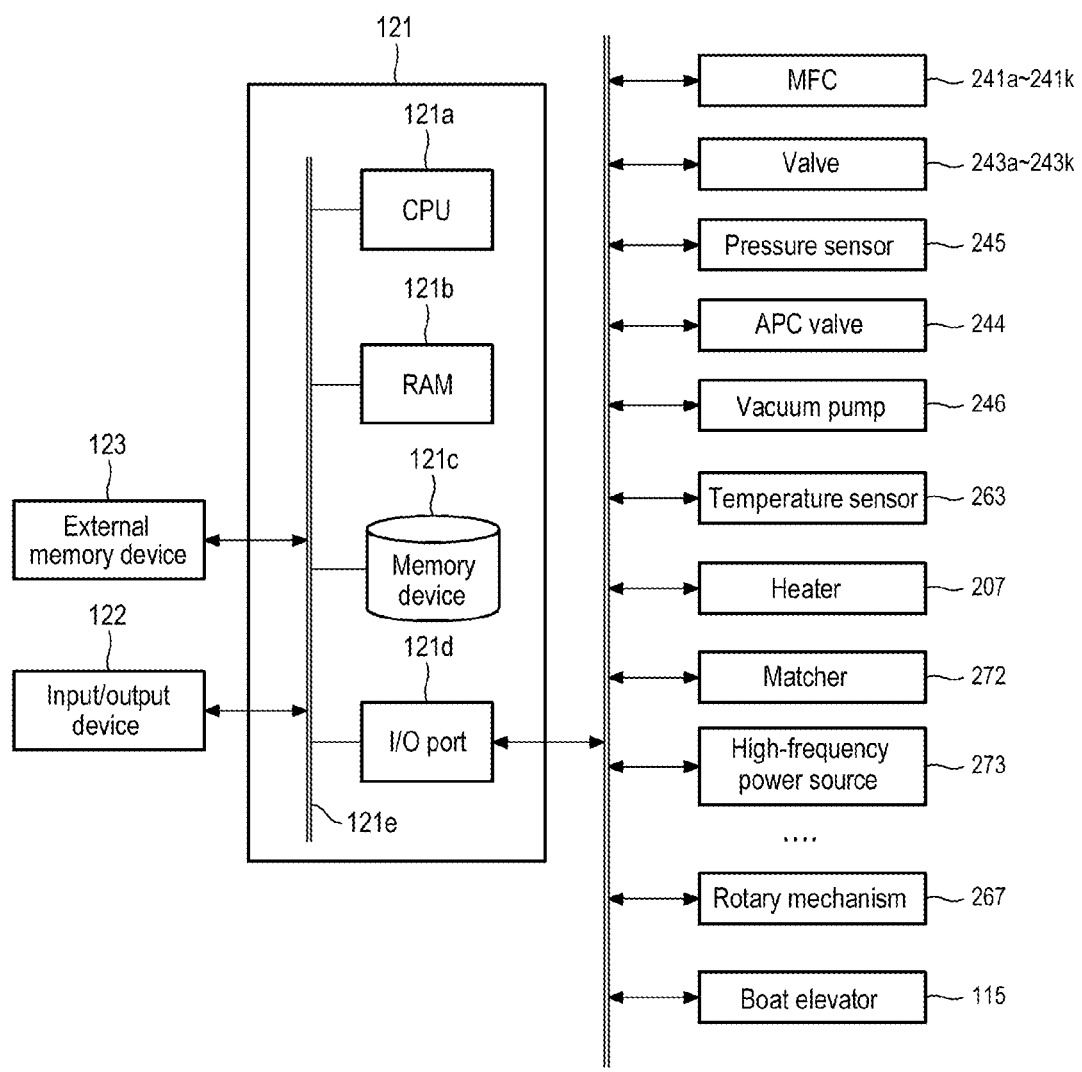
FIG. 3 is a schematic configuration view of a controller of the substrate processing apparatus according to one embodiment of the present disclosure, in which a control system of the controller is shown in a block diagram.

As illustrated in FIG. 3, a controller 121, which is a control unit (control means), is configured as a computer including a central processing unit (CPU) 121a, a random access memory (RAM) 121b, a memory device 121c, and an input/output (I/O) port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disc drive (HDD), or the like. A control program for controlling the operation of the substrate processing apparatus or a process recipe, in which substrate processing sequences and conditions are written, is readably stored in the memory device 121c. The process recipe is designed to obtain a predetermined result by causing the controller 121 to execute the respective sequences of a substrate processing process to be described later. The process recipe serves as a program. Hereinafter, the process recipe and the control program will be generally referred to as a "program". By the term "program" used herein, it is intended to encompass only the process recipe, only the control program, or both. The RAM 121b is configured as a memory area (work area) in which a program or data read by the CPU 121a is temporarily stored.

The I/O port 121d is connected to the MFCs 241a to 241k, the valves 243a to 243k, the pressure sensor 245, the APC valve 244, the vacuum pump 246, the heater 207, the temperature sensor 263, the high-frequency power source 273, the matcher 272, the rotary mechanism 267, the boat elevator 115 and the like.

The CPU 121a is configured to read and execute the control program from the memory device 121c. As an operation command is inputted from the input/output device 122, the CPU 121a reads the process recipe from the memory device 121c. The CPU 121a is configured to, pursuant to the content of the process recipe thus read, control: an operation of controlling the flow rates of various kinds of gases performed by the MFCs 241a to 241k, an opening/closing operation of the valves 243a to 243k, an opening/closing operation of the APC valve 244, a pressure regulating operation performed by the APC valve 244 based on the pressure sensor 245, a start/stop operation of the vacuum pump 246, a temperature adjusting operation performed by the heater 207 based on the temperature sensor 263, a power supply operation of the high-frequency power source 273, an impedance adjusting operation performed by the matcher 272, an operation of rotating the boat 217 and adjusting the rotation speed of the boat 217 performed by the rotary mechanism 267, an operation of moving the boat 217 up and down performed by the boat elevator 115, and the like.

The controller 121 is not limited to being configured as a dedicated computer but may be configured as a general-purpose computer. For example, the controller 121 of the present embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card) which stores the program, and installing the program on the general-purpose computer using the external memory device 123. However, a means for supplying the program to the computer is not limited to the case in which the program is supplied through the external memory device 123. For example, the program may be supplied through the use of a communication means such as the Internet or a dedicated line without having to go through the external memory device 123. The memory device 121c or the external memory device 123 is configured as a non-transitory computer-readable recording medium. Hereinafter, these means for supplying the program will be simply referred to as a "recording medium". By the term "recording medium" used herein, it is intended to encompass only the memory device 121c, only the external memory device 123, or both.

(2) Substrate Processing Process

Next, an example of a sequence of forming a thin film on a substrate, which is one of the processes of manufacturing a semiconductor device (device) through the use of the aforementioned substrate processing apparatus, will be described with reference to FIG. 4A. In the following description, the operations of the respective units or parts constituting the substrate processing apparatus are controlled by the controller 121.

Figure 4A:
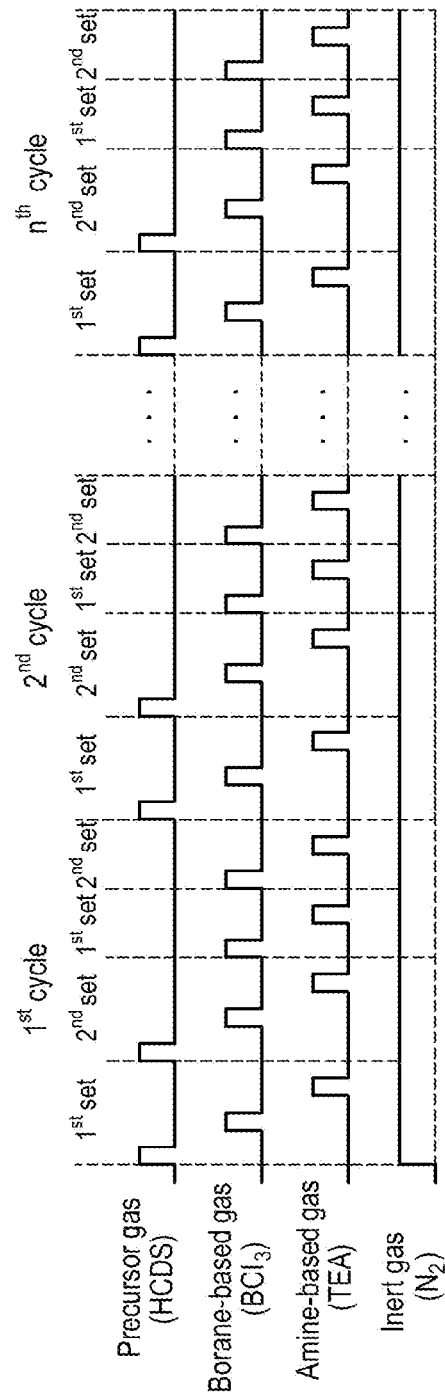
FIG. 4A is a view showing a gas supply timing in a film forming sequence according to one embodiment of the present disclosure.

In a film forming sequence shown in FIG. 4A, a laminated film is formed on each of the wafers 200 as substrates by performing, a predetermined number of times (n times), a cycle which includes: a step of forming a first film which contain at least Si, B and N; and a step of forming a second film which contains at least B and N and which differs in a composition ratio (or content ratio) of B to N (B content/N content, which will also be referred to as a B/N ratio) from the first film, wherein the first film and the second film are laminated to form the laminated film.

In the step of forming the first film, a silicon borocarbonitride (SiBCN) film containing Si, B, C and N is formed as the first film by performing, a predetermined number of times ($m_1$ times), a first set which includes a step of supplying an HCDS gas as a Si-containing precursor gas to the wafers 200, a step of supplying a $BCl_3$ gas as a boron-containing gas to the wafers 200 and a step of supplying a TEA gas as an N- and C-containing gas to the wafers 200.

In the step of forming the second film, a borocarbonitride (BCN) film is formed as the second film by performing, a predetermined number of times ($m_2$ times), a second set which includes a step of supplying a $BCl_3$ gas as a boron-containing gas to the wafers 200 and a step of supplying a TEA gas as an N- and C-containing gas to the wafers 200.

By the wording "performing a first set, a second set or a cycle a predetermined number of times", it is meant that that the first set, the second set or the cycle is performed once or a plurality of times. That is to say, the wording means that the first set, the second set or the cycle is performed one or more times. FIG. 4A illustrates an example of repeating n times the aforementioned cycle in which the first set and the second set are performed twice.

The term "wafer" used herein means "a wafer per se" or "a laminated body (aggregate) including a wafer and a specified layer or film formed on a surface of the wafer". That is to say, the wafer including a specified layer or film formed on a surface of the wafer may be called "a wafer". The term "surface of a wafer" used herein means "a surface (exposed surface) of a wafer per se" or "a surface of a specified layer or film formed on a wafer, namely an outermost surface of a wafer as a laminated body".

Accordingly, by stating that "a specified gas is supplied to a wafer" used herein, it is meant that "a specified gas is directly supplied to a surface (exposed surface) of a wafer per se" or that "a specified gas is supplied to a layer or film formed on a wafer, namely to an outermost surface of a wafer as a laminated body". Moreover, by the stating that "a specified layer (or film) is formed on a wafer" used herein, it is meant that "a specified layer (or film) is directly formed on a surface (exposed surface) of a wafer per se" or that "a specified layer (or film) is formed on a layer or film formed on a wafer, namely on an outermost surface of a wafer as a laminated body".

The term "substrate" used herein is defined similar to the term "wafer". In this case, the "substrate" may be considered to replace the "wafer" defined as above.

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 via the O-ring 220.

(Pressure Regulation and Temperature Adjustment)

Vacuum exhaust is performed by the vacuum pump 246 such that the internal pressure of the process chamber 201, namely the pressure of a space where the wafers 200 exist, becomes equal to a desired pressure (vacuum level). At this time, the internal pressure of the process chamber 201 is measured by the pressure sensor 245. The APC valve 244 is feedback-controlled based on the measured pressure information. The vacuum pump 246 remains activated at least until the processing for the wafers 200 is completed. The wafers 200 existing within the process chamber 201 are heated by the heater 207 to a desired temperature. At this time, the state of power being supplied to the heater 207 is feedback-controlled based on the temperature information detected by the temperature sensor 263 such that the interior of the process chamber 201 has a desired temperature distribution. The heating of the interior of the process chamber 201 by the heater 207 is continuously performed at least until the processing of the wafers 200 is completed. The boat 217 and wafers 200 begin to be rotated by the rotary mechanism 267. The rotation of the boat 217 and the wafers 200 by the rotary mechanism 267 is continuously performed at least until the processing for the wafers 200 is completed.

(First Film Forming Process)

Thereafter, the following three steps, i.e., steps 1 to 3 are sequentially performed.

[Step 1]

(HCDS Gas Supply)

The valve 243a is opened to cause the HCDS gas to flow through the gas supply pipe 232a. A flow rate of the HCDS gas is adjusted by the MFC 241a. The flow rate-adjusted HCDS gas is supplied into the process chamber 201 through the gas supply holes 250a and then exhausted through the exhaust pipe 231. At this time, the HCDS gas is supplied to the wafer 200. At the same time, the valve 243h is opened to cause a $N_2$ gas to flow through the gas supply pipe 232h. A flow rate of the $N_2$ gas is adjusted by the MFC 241h. The flow rate-adjusted $N_2$ gas is supplied into the process chamber 201 together with the HCDS gas and then exhausted through the exhaust pipe 231.

In order to prevent infiltration of the HCDS gas into the nozzles 249b to 249d and the buffer chamber 237, the valves 243i to 243k are opened to cause the $N_2$ gas to flow through the gas supply pipes 232i to 232k. The $N_2$ gas is supplied into the process chamber 201 via the gas supply pipes 232b to 232d, the nozzles 249b to 249d and the buffer chamber 237 and then exhausted through the exhaust pipe 231.

In this case, the APC valve 244 is appropriately adjusted such that the internal pressure of the process chamber 201 falls within a range of, e.g., 1 to 2,666 Pa, specifically, e.g., 67 to 1,333 Pa. A supply flow rate of the HCDS gas controlled by the MFC 241a is set to fall within a range of, e.g., 1 to 2,000 sccm, specifically, e.g., 10 to 1,000 sccm. A supply flow rate of the $N_2$ gas controlled by the MFCs 241h to 241k is set to fall within a range of, e.g., 100 to 10,000 sccm. A time period during which the HCDS gas is supplied to the wafer 200, i.e., a gas supply time (an irradiation time), is set to fall within a range of, e.g., 1 to 120 seconds, specifically, e.g., 1 to 60 seconds. The temperature of the heater 207 is set such that the temperature of the wafer 200 falls within a range of, e.g., 250 to 700 degrees C., specifically, e.g., 300 to 650 degrees C., or more specifically, e.g., 350 to 600 degrees C.

When the temperature of the wafer 200 is less than 250 degrees C., a practical deposition rate (or film forming rate) may not be obtained because the HCDS is hardly chemisorbed to the wafer 200. This problem can be solved by increasing the temperature of the wafer 200 to 250 degrees C. or more. By setting the temperature of the wafer 200 at 300 degrees C. or more, or more specifically 350 degrees C. or more, the HCDS can be more sufficiently adsorbed to the wafer 200. With such a configuration, a further sufficient deposition rate can be obtained.

If the temperature of the wafer 200 exceeds 700 degrees C., a CVD reaction is made stronger (a gas phase reaction becomes dominant). Thus, the film thickness uniformity may be degraded, making it difficult to control the film thickness uniformity. By setting the temperature of the wafer 200 at 700 degrees C. or less, such degradation of the film thickness uniformity can be suppressed, and it becomes possible to control the film thickness uniformity. In particular, by setting the temperature of the wafer 200 to 650 degrees C. or less, or furthermore 600 degrees C. or less, the surface reaction becomes dominant. This makes it easy to assure the film thickness uniformity and to control the film thickness uniformity.

Accordingly, the temperature of the wafer 200 may be set to fall within a range of 250 to 700 degrees C., specifically 300 to 650 degrees C., or more specifically 350 to 600 degrees C.

By supplying the HCDS gas to the wafer 200 under the aforementioned conditions, a first layer, e.g., a silicon-containing layer containing chlorine (Cl) and having a thickness of, e.g., less than one atomic layer to several atomic layers is formed on the wafer 200 (a base film of the surface). The silicon-containing layer containing chlorine (Cl) may be a silicon layer (a Si layer) containing Cl, an adsorption layer of the HCDS gas, or both.

The term "silicon layer containing Cl" is a generic name which encompasses not only a continuous or discontinuous layer formed of Si and containing Cl but also a Si thin film containing Cl obtained by laminating such layers. The continuous layer formed of Si and containing Cl may be referred to as a silicon thin film containing Cl. In addition, the Si that constitutes the silicon layer containing Cl includes Si whose bond to Cl is not completely broken, in addition to Si whose bond to Cl is completely broken.

The adsorption layer of the HCDS gas includes not only a continuous adsorption layer of molecules of the HCDS gas but also a discontinuous adsorption layer thereof. In other words, the adsorption layer of the HCDS gas may include an adsorption layer formed of HCDS molecules and having a thickness of one molecular layer or less than one molecular layer. HCDS molecules that constitute the adsorption layer of the HCDS gas include one or more molecules in which a bond between Si and Cl is partially broken. That is to say, the adsorption layer of the HCDS gas may include a physical adsorption layer of the HCDS gas, a chemical adsorption layer of the HCDS gas, or both.

In this regard, the layer having a thickness of less than one atomic layer means an atomic layer that is discontinuously formed. The layer having a thickness of one atomic layer means an atomic layer that is continuously formed. The layer having a thickness of less than one molecular layer means a molecular layer that is discontinuously formed. The layer having a thickness of one molecular layer means a molecular layer that is continuously formed. The silicon-containing layer containing Cl may include both a silicon layer containing Cl and an adsorption layer of the HCDS gas. As described above, expressions such as "one atomic layer", "several atomic layers" and the like will be used with respect to the silicon-containing layer containing Cl.

Under a condition in which the HCDS gas is autolyzed (or pyrolyzed), i.e., a condition in which a pyrolysis reaction of the HCDS gas occurs, Si is deposited on the wafer 200 to form the silicon layer containing Cl. Under a condition in which the HCDS gas is not autolyzed (or pyrolyzed), i.e., a condition in which a pyrolysis reaction of the HCDS gas does not occur, the HCDS gas is adsorbed onto the wafer 200 to form the adsorption layer of the HCDS gas. From the viewpoint of increasing a deposition rate, when the silicon layer containing Cl is formed on the wafer 200, the deposition rate may be greater than that when the adsorption layer of the HCDS gas is formed on the wafer 200.

If the thickness of the silicon-containing layer containing Cl formed on the wafer 200 exceeds several atomic layers, a modification action at steps 2 and 3 to be described later does not affect the entire first layer. In addition, a minimum value of the thickness of the first layer to be formed on the wafer 200 is less than one atomic layer. Accordingly, the thickness of the first layer may be set to fall within a range of less than one atomic layer to several atomic layers. By setting the thickness of the first layer to become equal to one atomic layer or less, i.e., one atomic layer or less than one atomic layer, it is possible to relatively increase the action of the modification reaction at steps 2 and 3 to be described later and to shorten the time required in the modification reaction at step 2. It is also possible to shorten the time required in forming the first layer at step 1. Eventually, a processing time per cycle can be reduced, and a total processing time can also be reduced. That is to say, the deposition rate can be increased. In addition, if the thickness of the first layer is set to become equal to one atomic layer or less, it is possible to improve the controllability of the film thickness uniformity.

(Residual Gas Removal)

After the first layer is formed, the valve 243a is closed to stop the supply of the HCDS gas. At this time, the APC valve 244 is kept opened and the interior of the process chamber 201 is vacuum-exhausted by the vacuum pump 246, whereby the unreacted HCDS gas or the HCDS gas contributed to the formation of the first layer, which remains within the process chamber 201, is removed from the process chamber 201. At this time, the valves 243h to 243k are kept opened and the supply of the $N_2$ gas into the process chamber 201 is maintained. The $N_2$ gas serves as a purge gas. Thus, the HCDS gas remaining within the process chamber 201 can be effectively removed from the process chamber 201.

At this time, the gas remaining in the process chamber 201 may not be completely removed and the interior of the process chamber 201 may not be completely purged. If the gas remaining in the process chamber 201 is small in amount, no adverse effect is generated at step 2 performed thereafter. The amount of the $N_2$ gas supplied into the process chamber 201 need not be a large amount. For example, if the $N_2$ gas is supplied in an amount substantially equal to the volume of the reaction tube 203 (or the process chamber 201), it is possible to perform the purge in such a way that no adverse effect is generated at step 2. Inasmuch as the interior of the process chamber 201 is not completely purged as mentioned above, it is possible to shorten the purge time and to improve the throughput. It also becomes possible to reduce the consumption of the $N_2$ gas to a minimum necessary level.

As the precursor gas, it is possible to use not only the HCDS gas but also an inorganic precursor gas such as a tetrachlorosilane gas, i.e., a silicon tetrachloride ($SiCl_4$, abbreviation: STC) gas, a trichlorosilane ($SiHCl_3$, abbreviation: TCS) gas, a dichlorosilane ($SiH_2Cl_2$, abbreviation: DCS) gas, a monochlorosilane ($SiH_3Cl$, abbreviation: MCS) gas, or the like. As the inert gas, it is possible to use not only the $N_2$ gas but also a rare gas such as an Ar gas, a He gas, a Ne gas, a Xe gas, or the like.

[Step 2]

($BCl_3$ Gas Supply)

After step 1 is completed, a $BCl_3$ gas is supplied to the wafer 200 existing within the process chamber 201.

At this step, the opening/closing control of the valves 243b and 243h to 243k is performed in the same or similar manner as the opening/closing control of the valves 243a and 243h to 243k performed at step 1. The supply flow rate of the $BCl_3$ gas controlled by the MFC 241b is set to fall within a range of, e.g., 100 to 10,000 sccm. The internal pressure of the process chamber 201 is set to fall within a range of, e.g., 1 to 2,666 Pa, specifically, e.g., 67 to 1,333 Pa. The partial pressure of the $BCl_3$ gas within the process chamber 201 is set to fall within a range of, e.g., 0.01 to 2,640 Pa. The time during which the $BCl_3$ gas is supplied to the wafer 200, namely the gas supply time (irradiation time), is set to fall within a range of, e.g., 1 to 120 seconds specifically, e.g., 1 to 60 seconds. Other processing conditions may be the same as, e.g., the processing conditions used at step 1.

By supplying the $BCl_3$ gas to the wafer 200 under the aforementioned conditions, for example, a boron-containing layer having a thickness of about less than one atomic layer to several atomic layers, specifically, e.g., a boron-containing layer having a thickness of less than one atomic layer, namely a discontinuous boron-containing layer, is formed on the first layer. In most cases, the boron-containing layer contains Cl. The boron-containing layer may include a boron layer, a chemical adsorption layer of the $BCl_3$ gas, or both. Depending on the conditions, the boron-containing layer may include a SiB layer which is formed by the reaction of the first layer with the $BCl_3$ gas and the resultant boriding (modification) of at least a portion of the first layer. The boron-containing layer is formed on the first layer, or the first layer is modified, whereby a second layer containing Si and B is formed on the wafer 200. Since the $BCl_3$ gas is a non-borazine-based boron-containing gas, the second layer becomes a borazine-ring-skeleton-free layer. The $BCl_3$ gas is supplied by thermally activating the same under a non-plasma condition. This makes it possible to softly perform the aforementioned reaction, thereby making it easy to form the second layer.

(Residual Gas Removal)

After the second layer is formed, the valve 243b is closed to stop the supply of the $BCl_3$ gas. Then, the unreacted $BCl_3$ gas, the $BCl_3$ gas contributed to the formation of the second layer, or the reaction byproduct, which remains within the process chamber 201, is removed from the interior of the process chamber 201 by the same or similar processing procedures as used at step 1. At this time, similar to step 1, the gas or the like which remains within the process chamber 201 may not be completely removed.

As the boron-containing gas, it may be possible to use a halogenated boron-based gas (haloborane-based gas) other than the $BCl_3$ gas, e.g., a chloroborane-based gas other than the $BCl_3$ gas, a fluoroborane-based gas such as a trifluoroborane ($BF_3$) gas or the like, and a bromoborane-based gas such as a tribromoborane ($BBr_3$) gas or the like. It is also possible to use a borane-based gas such as a $B_2H_6$ gas or the like. It is also possible to use not only the inorganic borane-based gas but also an organic borane-based gas. As the inert gas, it is possible to use not only the $N_2$ gas but also a rare gas such as an Ar gas, a He gas, a Ne gas, a Xe gas, or the like.

[Step 3]

(TEA Gas Supply)

After step 2 is completed, a TEA gas is supplied to the wafer 200 existing within the process chamber 201.

At the step of supplying the TEA gas, the opening/closing control of the valves 243d and 243h to 243k is performed in the same or similar manner as the opening/closing control of the valves 243a and 243h to 243k performed at step 1. The supply flow rate of the TEA gas controlled by the MFC 241d is set to fall within a range of, e.g., 100 to 10,000 sccm. The internal pressure of the process chamber 201 is set to fall within a range of, e.g., 1 to 5,000 Pa, specifically, e.g., 1 to 4,000 Pa. The partial pressure of the TEA gas within the process chamber 201 is set to fall within a range of, e.g., 0.01 to 4,950 Pa. The time during which the TEA gas is supplied to the wafer 200, namely the gas supply time (irradiation time), is set to fall within a range of, e.g., 1 to 200 seconds, specifically, e.g., 1 to 120 seconds, or more specifically, e.g., 1 to 60 seconds. Other processing conditions may be the same as, e.g., the processing conditions used at step 1.

By supplying the TEA gas to the wafer 200 under the aforementioned conditions, it is possible to have the second layer formed on the wafer 200 react with the TEA gas and to modify the second layer. At this time, the N component and the C component which were contained in the TEA gas are added to the second layer, whereby a third layer containing Si, B, C and N, namely a SiBCN layer, is formed on the wafer 200. The third layer becomes a borazine-ring-skeleton-free layer.

During the formation of the third layer, the Cl which was contained in the second layer or the H which was contained in the TEA gas forms a gaseous substance containing at least Cl or H in the course of the modification reaction of the second layer using the TEA gas. The gaseous substance thus formed is exhausted from the interior of the process chamber 201. That is to say, the impurities such as Cl and the like contained in the second layer are extracted or desorbed from the second layer and are eventually separated from the second layer. Thus, the third layer becomes a layer which is smaller in the amount of impurities such as Cl and the like than the second layer.

(Residual Gas Removal)

After the third layer is formed, the valve 243d is closed to stop the supply of the TEA gas. Then, the unreacted TEA gas, the TEA gas contributed to the formation of the third layer, or the reaction byproduct, which remains within the process chamber 201, is removed from the interior of the process chamber 201 by the same or similar processing procedures as used at step 1. At this time, similar to step 1, the gas or the like which remains within the process chamber 201 may not be completely removed.

As the N- and C-containing gas, it may be possible to use not only the TEA gas or the DEA gas but also, e.g., an ethylamine-based gas such as a monoethylamine ($C_2H_5NH_2$, abbreviation: MEA) gas or the like, a methylamine-based gas such as a trimethylamine (($CH_3)_3N$, abbreviation: TMA) gas, a dimethylamine (($CH_3)_2NH$, abbreviation: DMA) gas, a monomethylamine ($CH_3NH_2$, abbreviation: MMA) gas or the like, a propylamine-based gas such as a tripropylamine (($C_3H_7)_3N$, abbreviation: TPA) gas, a dipropylamine (($C_3H_7)_2NH$, abbreviation: DPA) gas, a monopropylamine ($C_3H_7NH_2$, abbreviation: MPA) gas or the like, an isopropylamine-based gas such as a triisopropylamine ($[(CH_3)_2CH]_3N$, abbreviation: TIPA) gas, a diisopropylamine ($[(CH_3)_2CH]_2NH$, abbreviation: DIPA) gas, a monoisopropylamine (($CH_3)_2CHNH_2$, abbreviation: MIPA) gas or the like, a butylamine-based gas such as a tributylamine ($(C_4H_9)_3N$, abbreviation: TBA) gas, a dibutylamine (($C_4H_9)_2NH$, abbreviation: DBA) gas, a monobutylamine ($C_4H_9NH_2$, abbreviation: MBA) gas or the like, and an isobutylamine-based gas such as a triisobutylamine ($[(CH_3)_2CHCH_2]_3N$, abbreviation: TIBA) gas, a diisobutylamine ($[(CH_3)_2CHCH_2]_2NH$, abbreviation: DIBA) gas, a monoisobutylamine (($CH_3)_2CHCH_2NH_2$, abbreviation: MIBA) gas or the like. That is to say, as the amine-based gas, it may be possible to use, for example, at least one of the gases expressed by the composition formulae: $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, and $[(CH_3)_2CHCH_2]_xNH_{3-x}$ (where x is an integer of from 1 to 3). In order to increase the C concentration while suppressing an increase of the N concentration in the first film, i.e., the finally-formed SiBCN film, a gas having a molecule in which the number of C atoms is larger than the number of N atoms may be used as the amine-based gas. That is to say, as the amine-based gas, a gas which contains at least one amine selected from a group consisting of TEA, DEA, MEA, TMA, DMA, TPA, DPA, MPA, TIPA, DIPA, MIPA, TBA, DBA, MBA, TIBA, DIBA and MIBA may be used.

As the N- and C-containing gas, it may be possible to use not only the amine-based gas but also, e.g., an organic hydrazine-based gas. In this regard, the organic hydrazine-based gas refers to gaseous organic hydrazine (compound), for example, a gas which is obtained by vaporizing organic hydrazine remaining in a liquid state at a normal temperature and a normal pressure or a gas which contains a hydrazine group, such as organic hydrazine or the like remaining in a gaseous state at a normal temperature and a normal pressure. The organic hydrazine-based gas may be simply referred to as an organic hydrazine gas or an organic hydrazine compound gas. The organic hydrazine-based gas is a Si-free gas composed of three elements, C, N and H, and is a gas which does not contain Si and metal. As the organic hydrazine-based gas, it may be possible to use, for example, a methylhydrazine-based gas such as a monomethylhydrazine (($CH_3$)$HN_2H_2$, abbreviation: MMH) gas, a dimethylhydrazine (($CH_3$)$_2N_2H_2$, abbreviation: DMH) gas, a trimethylhydrazine (($CH_3$)$_2N_2$ ($CH_3$)H, abbreviation; TMH) gas or the like, and an ethylhydrazine-based gas such as an ethylhydrazine (($C_2H_5$)$HN_2H_2$, abbreviation: EH) gas or the like. In order to increase the C concentration while suppressing an increase of the N concentration in the first film, i.e., the finally-formed SiBCN film, a gas having a molecule in which the number of C atoms is larger than the number of N atoms may be used as the organic hydrazine-based gas.

As the amine-based gas or the organic hydrazine-based gas, a gas having a plurality of C-containing ligands in one molecule, namely a gas having a plurality of hydrocarbon groups such as alkyl groups or the like in one molecule may be used. More specifically, as the amine-based gas or the organic hydrazine-based gas, a gas having three or two C-containing ligands (hydrocarbon groups such as alkyl groups or the like), i.e., organic ligands, in one molecule may be used.

(Performing a First Set a Predetermined Number of Times)

By performing one set (a first set) including the aforementioned steps 1 to 3 a predetermined number of times ($m_1$ times), a first film, i.e., a SiBCN film having a predetermined composition and a predetermined thickness, can be formed on the wafer 200. The first film becomes a borazine-ring-skeleton-free film, namely a non-porous film. At this time, the number of times the first set is performed is controlled such that the thickness of the first film becomes, e.g., 0.1 nm or more and 5 nm or less, specifically, e.g., 0.1 nm or more and 1 nm or less. The first set may be repeated a plurality of times within a range of, e.g., one or more time and 50 times or less, specifically, e.g., one or more times and 10 times or less. That is to say, the thickness of the SiBCN layer formed by performing the first set once may be set to be smaller than a desired film thickness and the first set may be repeated a plurality of times until the thickness of the first film becomes the desired film thickness.

At this time, by controlling the processing conditions such as the internal pressure of the process chamber 201, the gas supply time and the like at the respective steps, it is possible to adjust the ratio of respective element components, namely a Si component, a B component, a C component and an N component, in the first film. That is to say, it is possible to adjust a Si concentration, a B concentration, a C concentration and an N concentration in the first film. This makes it possible to control the composition ratio of the SiBCN film.

By stating that when the first set is performed a plurality of times, "a specified gas is supplied to the wafer 200" at least at the respective steps performed second and subsequent times, it is meant that "a specified gas is supplied to a layer formed on the wafer 200, namely on the outermost surface of the wafer 200 as a laminated body". By stating that "a specified layer is formed on the wafer 200", it is meant that "a specified layer is formed on a layer formed on the wafer 200, namely on the outermost surface of the wafer 200 as a laminated body". This is as described above. This holds true in the case where the second set or the cycle to be described later is performed a plurality of times. Moreover, this holds true in the respective modifications and other embodiments.

(Second Film Forming Process)

Thereafter, the following two steps, i.e., steps 4 and 5, are sequentially performed.

[Step 4]

($BCl_3$ Gas Supply)

A $BCl_3$ gas is supplied to the wafer 200 existing within the process chamber 201 by the same or similar processing procedures and processing conditions as used at step 2 described above. Thus, a fourth layer, e.g., a boron-containing layer having a thickness of about less than one atomic layer to several atomic layers, specifically, e.g., a boron-containing layer having a thickness of less than one atomic layer is formed on the first film formed on the wafer 200, namely on the SiBCN film. In most cases, the boron-containing layer contains Cl. The boron-containing layer may include a boron layer, a chemical adsorption layer of the $BCl_3$ gas, or both. The boron-containing layer, namely the fourth layer, becomes a borazine-ring-skeleton-free layer. The $BCl_3$ gas is supplied by thermally activating the same under a non-plasma condition. This makes it easy to form the fourth layer. These points are similar to those of step 2.

(Residual Gas Removal)

After the fourth layer is formed, the supply of the $BCl_3$ gas is stopped by the same or similar procedures as used at step 2. Furthermore, the unreacted $BCl_3$ gas or the $BCl_3$ gas contributed to the formation of the fourth layer, which remains within the process chamber 201, is removed from the interior of the process chamber 201. At this time, similar to step 2, the gas which remains within the process chamber 201 may not be completely removed.

[Step 5]

(TEA Gas Supply)

By the same or similar processing procedures and processing conditions as those of step 3 described above, a TEA gas is supplied to the wafer 200 existing within the process chamber 201. This makes it possible to have the fourth layer formed on the first film react with the TEA gas, thereby modifying the fourth layer. At this time, the N component and the C component which were contained in the TEA gas are added to the fourth layer, whereby a fifth layer containing B, C and N, namely a BCN layer, is formed on the first film, i.e., the SiBCN film. The fifth layer becomes a borazine-ring-skeleton-free layer.

During the formation of the fifth layer, the Cl which was contained in the fourth layer or the H which was contained in the TEA gas forms a gaseous substance containing at least Cl or H in the course of the modification reaction of the fourth layer using the TEA gas. The gaseous substance thus formed is exhausted from the interior of the process chamber 201. That is to say, the impurities such as Cl and the like contained in the fourth layer are extracted or desorbed from the fourth layer and are eventually separated from the fourth layer. Thus, the fifth layer becomes a layer which is smaller in the amount of impurities such as Cl and the like than the fourth layer.

(Residual Gas Removal)

After the fifth layer is formed, the supply of the TEA gas is stopped by the same or similar processing procedures as those of step 3. Then, the unreacted TEA gas, the TEA gas contributed to the formation of the fifth layer, or the reaction byproduct, which remains within the process chamber 201, is removed from the interior of the process chamber 201 by the same or similar processing procedures as those of step 1. At this time, similar to step 3, the gas or the like which remains within the process chamber 201 may not be completely removed.

(Performing a Second Set a Predetermined Number of Times)

By performing one set (a second set) including the aforementioned steps 4 and 5 a predetermined number of times ($m_2$ times), namely by alternately performing steps 4 and 5 one or more times, a second film, i.e., a BCN film having a predetermined composition and a predetermined thickness, can be formed on the first film, i.e., the SiBCN film. The second film becomes a borazine-ring-skeleton-free film, namely a non-porous film. At this time, the number of times the second set is performed is controlled such that the thickness of the second film becomes, e.g., 0.1 nm or more and 5 nm or less, specifically, e.g., 0.1 nm or more and 1 nm or less. As in the first film forming process, the second set may be repeated a plurality of times within a range of, e.g., one or more times and 50 times or less, specifically, e.g., one or more times and 10 times or less.

At this time, the composition ratio of the second film is controlled such that the B/N ratio in the second film differs from the B/N ratio in the first film. By controlling the processing conditions of the respective steps such as the internal pressure of the process chamber 201 or the gas supply time in the same or similar manner as in the first film forming process, it is possible to adjust the ratio of the respective element components, i.e., the B component, the C component and the N component, namely the B concentration, the C concentration and the N concentration in the BCN layer formed at step 5. This makes it possible to control the composition ratio of the second film.

For example, if the internal pressure of the process chamber 201 at step 4 of supplying the BCl$_3$ gas is set at a high pressure within the range of the aforementioned processing conditions, e.g., at a pressure higher than the internal pressure of the process chamber 201 used at step 2, or if the internal pressure of the process chamber 201 at step 5 of supplying the TEA gas is set at a low pressure within the range of the aforementioned processing conditions, e.g., at a pressure lower than the internal pressure of the process chamber 201 used at step 3, it is possible to make the B/N ratio in the second film larger (higher) than the B/N ratio in the first film. Conversely, if the internal pressure of the process chamber 201 at step 4 is set at a low pressure within the range of the aforementioned processing conditions, e.g., at a pressure lower than the internal pressure of the process chamber 201 used at step 2, or if the internal pressure of the process chamber 201 at step 5 is set at a high pressure within the range of the aforementioned processing conditions, e.g., at a pressure higher than the internal pressure of the process chamber 201 used at step 3, it is possible to make the B/N ratio in the second film smaller (lower) than the B/N ratio in the first film.

Furthermore, for example, if the supply time of the BCl$_3$ gas at step 4 is set at a long time within the range of the aforementioned processing conditions, e.g., at a time longer than the supply time of the BCl$_3$ gas at step 2, or if the supply time of the TEA gas at step 5 is set at a short time within the range of the aforementioned processing conditions, e.g., at a time shorter than the supply time of the TEA gas at step 3, it is possible to make the B/N ratio in the second film larger than the B/N ratio in the first film. Conversely, if the supply time of the BCl$_3$ gas at step 4 is set at a short time within the range of the aforementioned processing conditions, e.g., at a time shorter than the supply time of the BCl$_3$ gas at step 2, or if the supply time of the TEA gas at step 5 is set at a long time within the range of the aforementioned processing conditions, e.g., at a time longer than the supply time of the TEA gas at step 3, it is possible to make the B/N ratio in the second film smaller than the B/N ratio in the first film.

Moreover, for example, if the supply flow rate of the BCl$_3$ gas at step 4 is set at a large flow rate within the range of the aforementioned processing conditions, e.g., at a flow rate larger than the supply flow rate of the BCl$_3$ gas at step 2, or if the supply flow rate of the TEA gas at step 5 is set at a small flow rate within the range of the aforementioned processing conditions, e.g., at a flow rate smaller than the supply flow rate of the TEA gas at step 3, it is possible to make the B/N ratio in the second film larger than the B/N ratio in the first film. Conversely, if the supply flow rate of the BCl$_3$ gas at step 4 is set at a small flow rate within the range of the aforementioned processing conditions, e.g., at a flow rate smaller than the supply flow rate of the BCl$_3$ gas at step 2, or if the supply flow rate of the TEA gas at step 5 is set at a large flow rate within the range of the aforementioned processing conditions, e.g., at a flow rate larger than the supply flow rate of the TEA gas at step 3, it is possible to make the B/N ratio in the second film smaller than the B/N ratio in the first film.

At this time, the composition ratio of the second film may be controlled such that the second film differs in a composition ratio of B to C (B content/C content, which will also be referred to as a B/C ratio) from the first film. The control of the B/C ratio can be performed in the same or similar manner as the control of the B/N ratio. That is to say, by controlling the processing conditions of steps 4 and 5, such as the internal pressure of the process chamber 201, the gas supply time and the gas supply flow rate, in the aforementioned manner, it is possible to make the B/C ratio in the second film larger than or smaller than the B/C ratio in the first film.

As described above, for example, if the processing conditions of step 4 (such as the internal pressure of the process chamber 201, the gas supply time and the gas supply flow rate) are made different from the processing conditions of step 2, or if the processing conditions of step 5 (such as the internal pressure of the process chamber 201, the gas supply time and the gas supply flow rate) are made different from the processing conditions of step 3, it is possible to make the B/N ratio in the second film different from the B/N ratio in the first film or to make the B/C ratio in the second film different from the B/C ratio in the first film.

Furthermore, if the kind of the N- and C-containing gas used at step 5 is appropriately selected, it is possible to control the composition ratio of the second film such that the second film differs in a composition ratio of C to N (C content/N content, which will also be referred to as a C/N ratio) from the first film. That is to say, if the ratio of the number of C atoms to the number of N atoms contained in one molecule of the N- and C-containing gas used in forming the first film (the C/N ratio) is made different from the C/N ratio of the N- and C-containing gas used in forming the second film, it is possible to make the C/N ratio in the second film larger than or smaller than the C/N ratio in the first film. That is to say, if the kind of the N- and C-containing gas is made different at step 3 and step 5, it is possible to make the C/N ratio in the second film larger than or smaller than the C/N ratio in the first film. For example, if a TEA gas (C/N ratio=6/1) is used at step 3 and if a TPA gas (C/N ratio=9/1) is used at step 5, it is possible to make the C/N ratio in the second film larger than the C/N ratio in the first film. As a further example, if a TEA gas used at step 3 and if a DEA gas (C/N ratio=4/1) is used at step 5, it is possible to make the C/N ratio in the second film smaller than the C/N ratio in the first film.

(Performing a Cycle a Predetermined Number of Times)

By performing one cycle including the first film forming process and the second film forming process a predetermined number of times (n times), namely by alternately performing the first film forming process and the second film forming process one or more times, a laminated film (hereinafter referred to as a nano-laminated film) in which the first film (SiBCN film) and the second film (BCN film) differing in a B/N ratio from the first film are alternately laminated at a nanoscale thickness (or nano level) can be formed on the wafer 200. The laminated film as a whole becomes a film which contains Si, B, C and N and which does not contain a borazine ring skeleton.

(Purge and Return to Atmospheric Pressure)

The valves 243h to 243k are opened. A $N_2$ gas is supplied into the process chamber 201 from each of the gas supply pipes 232h to 232k and is exhausted from the exhaust pipe 231. The $N_2$ gas serves as a purge gas. Thus, the interior of the process chamber 201 is purged and the residual gas or the reaction byproduct remaining in the process chamber 201 is removed from the interior of the process chamber 201 (purge). Thereafter, the internal atmosphere of the process chamber 201 is substituted with an inert gas (inert gas substitution), and the internal pressure of the process chamber 201 returns to a normal pressure (return to atmospheric pressure).

(Boat Unloading and Wafer Discharge)

The seal cap 219 is moved down by the boat elevator 115 to open the lower end of the reaction tube 203. The processed wafer 200 supported by the boat 217 is unloaded from the lower end of the reaction tube 203 to the outside of the reaction tube 203 (boat loading). Thereafter, the processed wafer 200 is discharged from the boat 217 (wafer discharge).

(3) Effects According to the Present Embodiment

According to the present embodiment, one or more effects set forth below may be achieved.

(a) By controlling the composition ratios of the first film and the second film such that the second film differs in the B/N ratio from the first film, it becomes possible to improve the controllability of the composition ratio of the laminated film, i.e., the finally-formed SiBCN film. For example, the B/N ratio in the finally-formed SiBCN film can be controlled so as to become an arbitrary ratio between the B/N ratio of the first film and the B/N ratio of the second film.

Similarly, by controlling the composition ratios of the first film and the second film such that the second film differs in the B/C ratio from the first film, it becomes possible to improve the controllability of the composition ratio of the finally-formed SiBCN film. For example, the B/C ratio in the finally-formed SiBCN film can be controlled so as to become an arbitrary ratio between the B/C ratio of the first film and the B/C ratio of the second film.

Similarly, by controlling the composition ratios of the first film and the second film such that the second film differs in the C/N ratio from the first film, it becomes possible to improve the controllability of the composition ratio of the finally-formed SiBCN film. For example, the C/N ratio in the finally-formed SiBCN film can be controlled so as to become an arbitrary ratio between the C/N ratio of the first film and the C/N ratio of the second film.

That is to say, by making the in-film B:C:N ratio of the first film and the in-film B:C:N ratio of the second film different from each other, it is possible to finely adjust the in-film B:C:N ratio of the finally-formed SiBCN film and to precisely control the composition ratio of the finally-formed SiBCN film. In other words, it is possible to widen the window of control of the in-film Si, B, C and N composition ratio of the finally-formed SiBCN film. Particularly, it is possible to widen the window of control of the B, C and N composition ratio. At this time, by controlling the ratio of the thickness of the first film to the thickness of the second film, it is possible to further improve the controllability of the composition ratio of the finally-formed SiBCN film. This makes it possible to precisely and finely adjust at least one of the B concentration, the C concentration and the N concentration.

(b) By alternately laminating the first film which contains Si and the second film which does not contain Si, the Si concentration in the finally-formed SiBCN film can be controlled so as to become an arbitrary concentration less than the Si concentration in the first film. Furthermore, by making the B concentration, the C concentration and the N concentration in the first film different from the B concentration, the C concentration and the N concentration in the second film, it is possible to control the B concentration, the C concentration and the N concentration in the finally-formed SiBCN film so as to become arbitrary concentrations between the B concentration, the C concentration and the N concentration in the second film and the B concentration, the C concentration and the N concentration in the first film. This makes it possible to finely control one of the B concentration, the C concentration and the N concentration in the finally-formed SiBCN film.

(c) By alternately laminating the first film and the second film, it is possible to have the finally-formed SiBCN film become a film having the characteristics of one or both of the first film and the second film, or a film having the intermediate characteristics between the first film and the second film, or a film having the characteristics differing from those of the first film and the second film. In this case, as described above, the thickness of each of the first film and the second film is, e.g., 0.1 nm or more and 5 nm or less, specifically, e.g., 0.1 nm or more and 1 nm or less.

It is difficult to form each of the first film and the second film to have a thickness of less than 0.1 nm. Furthermore, if the thickness of one of the first film and the second film exceeds 5 nm, it is sometimes the case that the finally-formed SiBCN film becomes a film having non-uniform (inconsistent) characteristics in the lamination direction, namely a film having isolated characteristics in the lamination direction due to the mere lamination of the first film and the second film. By setting the thickness of each of the first film and the second film to become 0.1 nm or more and 5 nm or less, specifically, e.g., 0.1 nm or more and 1 nm or less, it is possible to have the finally-formed SiBCN film become a film having consistent characteristics in the lamination direction, namely a film in which the characteristics and properties of the first film and the second film are properly fused. That is to say, by setting the thickness of each of the first film and the second film to fall within the aforementioned range, it is possible to have the finally-formed SiBCN film become a nano-laminated film having integral characteristics as a whole of the film. Moreover, by setting the number of times each of the aforementioned sets ($m_1$ times or $m_2$ times) is performed to become one or more times and 50 times or less, specifically, e.g., one or more times and 10 times or less, it is possible to have the thickness of each of the first film and the second film fall within the aforementioned range.

(d) If a gas having high absorptivity, such as the HCDS gas, the $BCl_3$ gas or the like, is used when forming the first film and the second film, it is possible to efficiently perform the formation of the respective films. As a result, it becomes possible to increase the deposition rate of the finally-formed SiBCN film. It is also possible to reduce consumption of the gas not contributing to film formation, thereby reducing the film formation cost.

(e) If a precursor gas containing two Si atoms in one molecule, such as the HCDS gas or the like, is used when forming the first film, it is possible to have the finally-formed SiBCN film become a film in which Si atoms contained in the film adjoin each other. More specifically, when the first layer is formed under a condition in which the HCDS gas is not autolyzed, two Si atoms contained in an HCDS gas molecule are adsorbed onto the wafer 200 (the base film of the surface) in a mutually adjoining state. Furthermore, when the first layer is formed under a condition in which the HCDS gas is autolyzed, two Si atoms contained in an HCDS gas molecule have a strong tendency to be deposited on the wafer 200 in a mutually adjoining state. If a gas containing two Si atoms in one molecule, such as the HCDS gas or the like, is used as mentioned above, the Si atoms contained in the first layer can be kept in a mutually adjoining state, which is not possible in the case of using a gas containing only one Si atom in one molecule, such as a dichlorosilane ($SiH_2Cl_2$, abbreviation: DCS) gas or the like. As a result, it is possible to have the first film or the second film, namely the finally-formed SiBCN film, become a film in which Si atoms adjoin each other. This makes it possible to improve the HF resistance of the film.

(f) If different kinds of gases are supplied non-simultaneously or alternately when forming the first film and the second film, it is possible to allow the gases to react under a condition in which a surface reaction is dominant. As a result, it is possible to improve the step coverage of the finally-formed SiBCN film and the controllability of the film thickness. It is also possible to avoid an excessive gas-phase reaction otherwise occurring within the process chamber 201 and to suppress generation of particles.

(4) Modifications

The film forming sequence according to the present embodiment is not limited to the example illustrated in FIG. 4A but may be modified as in the modifications described below.

(Modification 1)

When forming the second film, at step 5, a borazine-ring-skeleton-containing gas such as a TMB gas or the like may be supplied in place of the TEA gas. That is to say, after step 4 of supplying the $BCl_3$ gas, it may be possible to perform a step of supplying a borazine-based gas such as a TMB gas or the like. As described above, the borazine-based gas serves not only as a B source but also as an N source and a C source similar to the amine-based gas or the like.

When supplying the TMB gas at step 5, the opening/closing control of the valves 243*f* and 243*h* to 243*k* is performed in the same or similar manner as the opening/closing control of the valves 243*a* and 243*h* to 243*k* performed at Step 1. The supply flow rate of the TMB gas controlled by the MFC 241*f* is set to fall within a range of, e.g., 1 to 1,000 sccm. The internal pressure of the process chamber 201 is set to fall within a range of, e.g., 1 to 2,666 Pa, specifically, e.g., 67 to 1,333 Pa. The partial pressure of the TMB gas within the process chamber 201 is set to fall within a range of, e.g., 0.0001 to 2,424 Pa. The time during which the TMB gas is supplied to the wafer 200, namely the gas supply time (irradiation time), is set to fall within a range of, e.g., 1 to 120 seconds, specifically, e.g., 1 to 60 seconds. Other processing procedures and processing conditions may be the same as, e.g., the processing procedures and processing conditions of Step 1.

As the TMB gas is supplied to the wafer 200 under the aforementioned conditions, the fourth layer (boron-containing layer) formed at step 4 reacts with the TMB gas. That is to say, the Cl (chloro group) contained in the fourth layer reacts with the ligand (methyl group) contained in the TMB. Thus, the Cl of the fourth layer reacting with the ligand of the TMB can be separated (extracted) from the fourth layer. The ligand of the TMB reacting with the Cl of the fourth layer can be separated from the TMB. Then, the N that constitutes the borazine ring of the TMB from which the ligand is separated can be bonded to the B of the fourth layer. That is to say, among B and N constituting the borazine ring of the TMB, the N caused to have an uncombined hand (i.e., a dangling bond) due to the separation of the methyl ligand may be bonded to the B included in the fourth layer and caused to have an uncombined hand or the B originally provided with an uncombined hand, thereby forming a B—N bond. At this time, the borazine ring skeleton constituting the borazine ring of the TMB is maintained without being broken.

By supplying the TMB gas under the aforementioned conditions, it is possible to have the fourth layer and the TMB properly react with each other while maintaining the borazine ring skeleton of the TMB without destroying the same. This makes it possible to generate the series of reactions described above. Most important factors (conditions) for generating the series of reactions while maintaining the borazine ring skeleton of the TMB are considered to be the temperature of the wafer 200 and the internal temperature of the process chamber 201, particularly the temperature of the wafer 200. By appropriately controlling those factors, it becomes possible to generate appropriate reactions.

Through the series of reactions, the borazine ring is newly introduced into the fourth layer, and the fourth layer is changed (or modified) into a fifth layer having a borazine ring skeleton and containing B, C, and N, i.e., a borocarbonitride (BCN) layer having a borazine ring skeleton. The fifth layer becomes a layer having a thickness of, for example, from less than one atomic layer to several atomic layers. The BCN layer including the borazine ring skeleton may also be referred to as a layer containing B, C and a borazine ring skeleton, or as a layer containing C and a borazine ring skeleton.

As the borazine ring is newly introduced into the fourth layer, the B component and the N component constituting the borazine ring are introduced into the fourth layer. At this time, the C component contained in the ligand of the TMB is also introduced into the fourth layer. As described above, if the borazine ring is introduced into the fourth layer by causing the fourth layer and the TMB to react with each other, it is possible to add the B component, the C component and the N component to the fourth layer.

During the formation of the fifth layer, the Cl which was contained in the fourth layer or the H which was contained in the TMB gas forms a gaseous substance containing at least Cl or H in the course of the modification reaction of the fourth layer using the TMB gas. The gaseous substance thus formed is exhausted from the interior of the process chamber 201. That is to say, the impurities such as Cl and the like contained in the fourth layer are extracted or desorbed from the fourth layer and are eventually separated from the fourth layer. Thus, the fifth layer becomes a layer which is smaller in the amount of impurities such as Cl and the like than the fourth layer.

During the formation of the fifth layer, by maintaining the borazine ring skeleton constituting the borazine ring in the TMB without being broken, it is possible to maintain a central space of the borazine ring. Thus, a porous BCN layer can be formed.

After the fifth layer is formed, the valve 243f is closed to stop the supply of the TMB gas. Then, the unreacted TMB gas, the TMB gas contributed to the formation of the fifth layer, or the reaction byproduct, which remains within the process chamber 201, is removed from the interior of the process chamber 201 by the same processing procedures as used at step 1. At this time, similar to step 1, the gas or the like which remains within the process chamber 201 may not be completely removed.

As the borazine-ring-skeleton-containing gas, it may be possible to use not only the TMB gas but also, e.g., a TEB gas, a TPB gas, a TIPB gas, a TBB gas or a TIBB gas. As the inert gas, it is possible to use not only the $N_2$ gas but also a rare gas such as an Ar gas, a He gas, a Ne gas, a Xe gas, or the like.

Thereafter, similar to the second film forming process of the film forming sequence shown in FIG. 4A, the second set is performed a predetermined number of times ($m_2$ times), whereby a second film, i.e., a BCN film containing a borazine ring skeleton, is formed on the first film (SiBCN film) which does not contain a borazine ring skeleton.

According to this modification, there are provided the same or similar effects as achieved in the film forming sequence illustrated in FIG. 4A.

In addition, when forming the second film, the TMB gas is supplied to the wafer 200 under the aforementioned conditions, whereby not only the B component contained in the $BCl_3$ gas but also the B component contained in the TMB gas can be added to the second film. In this way, two kinds of B sources (double boron sources) are used when forming the second film. It is therefore possible to make the B concentration in the second film higher than that available in the film forming sequence illustrated in FIG. 4A. As a result, it is possible to increase the B concentration in the finally-formed SiBCN film. This makes it possible to have the finally-formed SiBCN film become a B-rich film.

By having the second film become a film which contains a borazine ring skeleton, it is possible to improve the controllability of the density, i.e., the in-film atom density, of the finally-formed SiBCN film. As a result, it becomes possible to improve the controllability of the dielectric constant of the finally-formed SiBCN film. More specifically, the second film (porous film) containing a borazine ring skeleton becomes a film which is lower in the in-film atom density and in the dielectric constant than the first film (non-porous film) which does not contain a borazine ring skeleton. Thus, by alternately laminating the first film and the second film, it is possible to make the dielectric constant of the finally-formed SiBCN film lower than the dielectric constant of the SiBCN which does not contain a borazine ring skeleton. That is to say, the dielectric constant of the finally-formed SiBCN film can be set at a value which cannot be realized in the case of forming the SiBCN which does not contain a borazine ring skeleton. This makes it possible to widen the dielectric constant control window.

Moreover, by controlling the ratio of the thickness of the first film to the thickness of the second film, it becomes possible to finely adjust the dielectric constant of the finally-formed SiBCN film.

By having the second film become a film which contains a borazine ring skeleton, it is possible to improve the controllability of the oxidation resistance of the finally-formed SiBCN film. More specifically, the second film containing a borazine ring skeleton contains B as one constituent element of the borazine ring skeleton which constitutes the film. The B—N bond constituting the borazine ring skeleton has a strong bond. For that reason, the second film is lower in the amount of desorption of B from the film caused by oxidation than the first film which does not contain a borazine ring skeleton. Thus, the second film becomes a film which is high in the resistance to oxygen plasma, namely a film which is high in ashing resistance. By alternately laminating the first film and the second film, the oxidation resistance of the finally-formed SiBCN film can be made higher than the oxidation resistance of the SiBCN which does not contain a borazine ring skeleton. That is to say, the oxidation resistance of the finally-formed SiBCN film can be made a characteristic which cannot be realized in the case of forming the SiBCN which does not contain a borazine ring skeleton. This makes it possible to widen the window of oxidation resistance control, i.e., ashing resistance control.

By alternately laminating the first film and the second film, it is possible to suppress a decrease in the surface roughness of the finally-formed SiBCN film. The term "surface roughness" means the height difference in a wafer surface or in an arbitrary object surface. The surface roughness has the same meaning as the surface coarseness. By stating that the surface roughness is improved (good), it is meant that the height difference is reduced (small), namely that the surface is smoothened (smooth). By stating that the surface roughness is worsened (poor), it is meant that the height difference is increased (large), namely that the surface is roughened (rough). There is a tendency that the borazine-ring-skeleton-free first film becomes better in the surface roughness than the borazine-ring-skeleton-containing second film. Thus, by alternately laminating the first film and the second film, it becomes possible to improve the surface roughness of the finally-formed SiBCN film. That is to say, by alternately laminating the first film and the second film, it is possible to make the surface roughness of the finally-formed SiBCN film higher than the surface roughness of the borazine-ring-skeleton-containing SiBCN film (single film) formed using the HCDS gas or the TMB gas.

At this time, if the formation of the borazine-ring-skeleton-free first film is performed prior to the formation of the borazine-ring-skeleton-containing second film, it is possible to further suppress a decrease in the surface roughness of the finally-formed SiBCN film. That is to say, if the first film having good surface roughness is formed as a base of the second film prior to forming the second film and if the second film is formed on the first film, the second film is affected by the base. This makes it possible to improve the surface roughness of the second film. As a result, it becomes possible to further suppress a decrease in the surface roughness of the finally-formed SiBCN film.

At this time, if the borazine-ring-skeleton-free first film is finally formed, it becomes possible to further suppress a decrease in the surface roughness of the finally-formed SiBCN film. That is to say, if the uppermost portion of the finally-formed SiBCN film, i.e., the laminated film, is configured by the first film having good surface roughness, it becomes possible to further suppress a decrease in the surface roughness of the finally-formed SiBCN film.
(Modification 2)

As shown in FIG. 4B, the formation of the first film may be performed after performing the formation of the second film. Furthermore, when forming the first film, step 2 of supplying the BCl$_3$ gas and step 3 of supplying the TEA gas may not be performed and, instead, the step of supplying the borazine-ring-skeleton-containing gas such as the TMB gas or the like may be performed. That is to say, the step of supplying the borazine-based gas such as the TMB gas or the like may be performed after performing step 1 of supplying the HCDS gas. As described above, the borazine-based gas acts as a B source, an N source and a C source. In this case, as will be described later, the first film becomes a SiBCN film which contains a borazine ring skeleton. Thus, the formation of the first film may be performed after performing the formation the second film which does not contain a borazine ring skeleton.

The step of supplying the TMB gas after step 1 is performed by, e.g., the same processing procedures and processing conditions as those of step 5 when the second film containing a borazine ring skeleton is formed in modification 1 described above. As the borazine-based gas, it may be possible to use not only the TMB gas but also the borazine-based gases described above.

As the TMB gas is supplied to the wafer 200 under the aforementioned conditions, the first layer (the Si-containing layer which contains Cl) formed at step 1 reacts with the TMB gas. That is to say, the Cl contained in the first layer reacts with the ligand contained in the TMB. Thus, the Cl of the first layer reacting with the ligand of the TMB can be separated from the first layer. The ligand of the TMB reacting with the Cl of the first layer can be separated from the TMB. Then, the N that constitutes the borazine ring of the TMB from which the ligand is separated can be bonded to the Si of the first layer. That is to say, among B and N constituting the borazine ring of the TMB, the N caused to have an uncombined hand due to the separation of the methyl ligand may be bonded to the Si included in the first layer and caused to have an uncombined hand or the Si originally provided with an uncombined hand, thereby forming a Si—N bond. At this time, the borazine ring skeleton constituting the borazine ring of the TMB is maintained without being broken.

By supplying the TMB gas under the aforementioned conditions, it is possible to have the first layer and the TMB properly react with each other while maintaining the borazine ring skeleton of the TMB without destroying the same. This makes it possible to generate the series of reactions described above. Most important factors for generating the series of reactions while maintaining the borazine ring skeleton of the TMB are considered to be the temperature of the wafer 200 and the internal temperature of the process chamber 201, particularly the temperature of the wafer 200. By appropriately controlling those factors, it becomes possible to generate appropriate reactions.

Through the series of reactions, the borazine ring is newly introduced into the first layer, and the first layer is changed (or modified) into a second layer having a borazine ring skeleton and containing Si, B, C, and N, i.e., a silicon borocarbonitride (SiBCN) layer having a borazine ring skeleton. The second layer becomes a layer having a thickness of, for example, from less than one atomic layer to several atomic layers. The SiBCN layer including the borazine ring skeleton may also be referred to as a layer containing Si, C and a borazine ring skeleton.

As the borazine ring is newly introduced into the first layer, the B component and the N component constituting the borazine ring are introduced into the first layer. At this time, the C component contained in the ligand of the TMB is also introduced into the fifth layer. As described above, if the borazine ring is introduced into the fifth layer by causing the first layer and the TMB to react with each other, it is possible to add the B component, the C component and the N component to the first layer.

During the formation of the second layer, the Cl which was contained in the first layer or the H which was contained in the TMB gas forms a gaseous substance containing at least Cl or H in the course of the modification reaction of the first layer using the TMB gas. The gaseous substance thus formed is exhausted from the interior of the process chamber 201. That is to say, the impurities such as Cl and the like contained in the first layer are extracted or desorbed from the first layer and are eventually separated from the first layer. Thus, the second layer becomes a layer which is smaller in the amount of impurities such as Cl and the like than the first layer.

During the formation of the second layer, by maintaining the borazine ring skeleton constituting the borazine ring in the TMB without being broken, it is possible to maintain a central space of the borazine ring. Thus, a porous SiBCN layer can be formed.

After the second layer is formed, the valve 243f is closed to stop the supply of the TMB gas. Then, the unreacted TMB gas, the TMB gas contributed to the formation of the second layer, or the reaction byproduct, which remains within the process chamber 201, is removed from the interior of the process chamber 201 by the same processing procedures as used at step 1. At this time, similar to step 1, the gas or the like which remains within the process chamber 201 may not be completely removed.

Thereafter, similar to the first film forming process of the film forming sequence shown in FIG. 4A, the first set is performed a predetermined number of times (m$_1$ times), whereby a first film, i.e., an SiBCN film containing a borazine ring skeleton, is formed on the second film which does not contain a borazine ring skeleton.

According to this modification, there are provided the same or similar effects as achieved in the film forming sequence illustrated in FIG. 4A.

In addition, by having the first film become a film which contains a borazine ring skeleton, it is possible to provide the same or similar effects as achieved in modification 1 described above. That is to say, it is possible to improve the controllability of the dielectric constant of the finally-formed SiBCN film and the controllability of the oxidation resistance of the finally-formed SiBCN film. By alternately laminating the first film which contains a borazine ring skeleton and the second film which does not contain a borazine ring skeleton, it is possible to suppress a decrease in the surface roughness of the finally-formed SiBCN film. At this time, the formation of the borazine-ring-skeleton-free second film is performed prior to the formation of the borazine-ring-skeleton-containing first film. This makes it possible to further suppress a decrease in the surface roughness of the finally-formed SiBCN film. In this case, the borazine-ring-skeleton-free first film is finally formed. This makes it possible to further suppress a decrease in the surface roughness of the finally-formed SiBCN film.

When forming the first film, the number of steps performed in the first set is reduced to two. This makes it possible to shorten the time required in forming the first film. Consequently, it is possible to shorten the processing time per one cycle, thereby shortening the total processing time, namely increasing the deposition rate.

(Modification 3)

As shown in FIG. 5A, when forming the second film, at step 5, a nitrogen-containing gas such as an $NH_3$ gas or the like may be supplied in place of the TEA gas. That is to say, at step 5 performed after step 4 of supplying the $BCl_3$ gas, for example, a thermally activated $NH_3$ gas or a plasma-activated $NH_3$ gas may be supplied as the nitrogen-containing gas.

When supplying the thermally activated $NH_3$ gas at step 5, the opening/closing control of the valves 243c and 243h to 243k is performed in the same or similar manner as the opening/closing control of the valves 243a and 243h to 243k performed at step 1. The supply flow rate of the $NH_3$ gas controlled by the MFC 241c is set to fall within a range of, e.g., 100 to 10,000 sccm. The internal pressure of the process chamber 201 is set to fall within a range of, e.g., 1 to 4,000 Pa, specifically, e.g., 1 to 3,000 Pa. The partial pressure of the $NH_3$ gas within the process chamber 201 is set to fall within a range of, e.g., 0.01 to 3,960 Pa. By setting the internal pressure of the process chamber 201 to fall within such a relatively high pressure zone, it becomes possible to thermally activate the $NH_3$ gas under a non-plasma condition. If the $NH_3$ gas is supplied by thermally activating the same, it is possible to generate a relatively soft reaction and to relatively softly perform the nitriding to be performed later. The time during which the thermally activated $NH_3$ gas is supplied to the wafer 200, namely the gas supply time (irradiation time), is set to fall within a range of, e.g., 1 to 120 seconds, specifically, e.g., 1 to 60 seconds. Other processing conditions may be the same as, e.g., the processing conditions used at step 1.

When supplying the plasma-activated $NH_3$ gas at step 5, the opening/closing control of the valves 243c and 243h to 243k is performed in the same or similar manner as the opening/closing control of the valves 243a and 243h to 243k performed at step 1. The supply flow rate of the $NH_3$ gas controlled by the MFC 241c is set to fall within a range of, e.g., 100 to 10,000 sccm. The high-frequency power applied between the rod-shaped electrodes 269 and 270 is set to fall within a range of, e.g., 50 to 1,000 W. The internal pressure of the process chamber 201 is set to fall within a range of, e.g., 1 to 100 Pa. The partial pressure of the $NH_3$ gas within the process chamber 201 is set to fall within a range of, e.g., 0.01 to 100 Pa. Even if the internal pressure of the process chamber 201 is set to fall within such as relatively low pressure zone, the use of plasma makes it possible to activate the $NH_3$ gas. The time during which the active species obtained by plasma-exciting the $NH_3$ gas are supplied to the wafer 200, namely the gas supply time (irradiation time), is set to fall within a range of, e.g., 1 to 120 seconds, specifically, e.g., 1 to 60 seconds. Other processing conditions may be the same as, e.g., the processing conditions used at step 1.

As the nitrogen-containing gas, it may be possible to use not only the $NH_3$ gas but also, e.g., a hydrogen nitride-based gas such as a diazene ($N_2H_2$) gas, a hydrazine ($N_2H_4$) gas, an $N_3H_8$ gas or the like, or a gas containing these compounds.

By supplying the $NH_3$ gas to the wafer 200 under the aforementioned conditions, at least a portion of the fourth layer (boron-containing layer) formed on the first film is nitrided (modified). As the fourth layer is modified, a fifth layer containing B and N, namely a BN layer, is formed on the first film. The fifth layer becomes a borazine-ring-skeleton-free layer. During the formation of the fifth layer, the impurities such as Cl and the like contained in the fourth layer form a gaseous substance containing at least Cl in the course of the modification reaction of the fourth layer using the $NH_3$ gas. The gaseous substance thus formed is exhausted from the interior of the process chamber 201. That is to say, the impurities such as Cl and the like contained in the fourth layer are extracted or desorbed from the fourth layer and are eventually separated from the fourth layer. Thus, the fifth layer becomes a layer which is smaller in the amount of impurities such as Cl and the like than the fourth layer.

After the fifth layer is formed, the valve 243c is closed to stop the supply of the $NH_3$ gas. In the case where the $NH_3$ gas is supplied by activating the same with plasma, the application of the high-frequency power between the rod-shaped electrodes 269 and 270 is stopped. Then, the unreacted $NH_3$ gas, the $NH_3$ gas contributed to the formation of the fifth layer, or the reaction byproduct, which remains within the process chamber 201, is removed from the interior of the process chamber 201 by the same processing procedures as used at step 1. At this time, similar to step 1, the gas or the like which remains within the process chamber 201 may not be completely removed.

By performing the second set a predetermined number of times ($m_2$ times) in the same or similar manner as in the second film forming process of the film forming sequence shown in FIG. 4A, a BN film as a second film is formed on the first film.

According to this modification, there are provided the same or similar effects as achieved in the film forming sequence shown in FIG. 4A. Particularly, it is possible to widen the window of control of the B and N composition ratio within the finally-formed SiBCN film. Furthermore, it is possible to finely adjust the B/N ratio in the finally-formed SiBCN film. It is also possible to finely adjust at least one of the B concentration and the N concentration within the film. By supplying the $NH_3$ gas, the impurities such as Cl and the like are desorbed from the fourth layer. This makes it possible to reduce the impurity concentration within the finally-formed SiBCN film and to improve the HF resistance of the film.

(Modification 4)

Figure 5B:
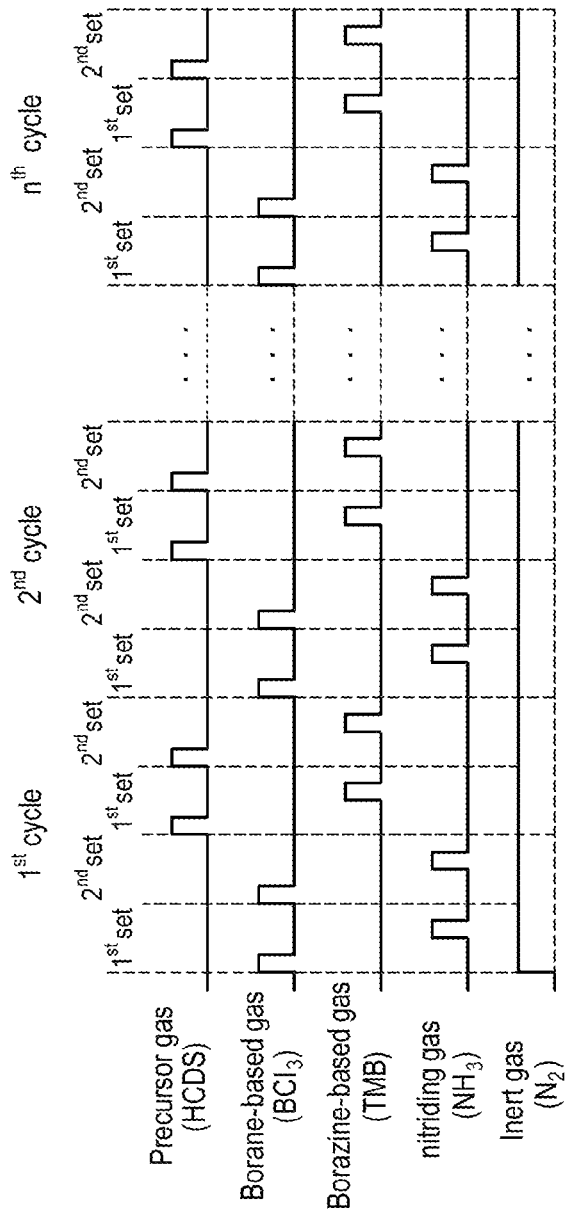

As shown in FIG. 5B, modifications 2 and 3 may be combined with each other. That is to say, a borazine-ring-skeleton-free BN film is first formed as the second film. Then, a borazine-ring-skeleton-containing SiBCN film as the first film may be formed on the second film. In this modification, the formation of the respective films (the first film and the second film) constituting the laminated film is performed by, e.g., the processing procedures and the processing conditions described in modifications 2 and 3. According to this modification, there are provided the same or similar effects as achieved in the film forming sequence shown in FIG. 4A and in modifications 2 and 3.

(Modification 5)

Figure 6A:
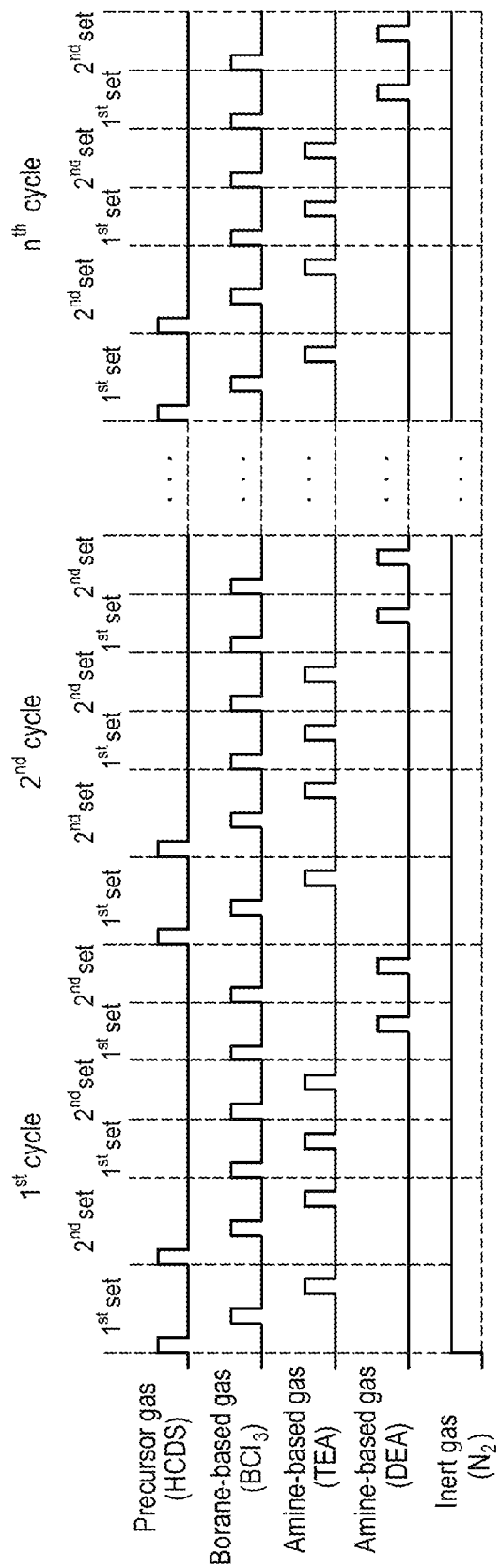
FIGS. 6A and 6B are views respectively showing fifth and eighth modifications of the gas supply timing in the film forming sequence.

As shown in FIG. 6A, the aforementioned cycle may further include a step of forming a third film which contains at least B and N and which differs in a B/N ratio from the first film and the second film. By performing this cycle a predetermined number of times, it may be possible to form a laminated film (nano-laminated film) composed of the first film, the second film and the third film laminated one above another.

In this modification, the formation of the first film and the second film is performed by the same processing procedures and processing conditions as those used in forming the first film and the second film in the film forming sequence shown in FIG. 4A. When forming the third film, a third set including steps 6 and 7 which are the same as steps 4 and 5 used in forming the second film is performed a predetermined number of times ($m_3$ times). FIG. 6A shows an example in which each of the first set, the second set and the third set is performed twice and in which the aforementioned cycle is repeated n times. In step 6, the $BCl_3$ gas is used as the boron-containing gas. In step 7, the DEA gas rather than the TEA gas is used as the N- and C-containing gas.

Step 6 of supplying the $BCl_3$ gas is performed by the same processing procedures and processing conditions as those of step 4 described above. By performing step 6, a boron-containing layer as a sixth layer is formed on the second film.

At step 7 of supplying the DEA gas, the opening/closing control of the valves 243e and 243h to 243k is performed in the same or similar manner as the opening/closing control of the valves 243a and 243h to 243k performed at Step 1. The supply flow rate of the DEA gas controlled by the MFC 241e is set to fall within a range of, e.g., 100 to 10,000 sccm. The internal pressure of the process chamber 201 is set to fall within a range of, e.g., 1 to 5,000 Pa, specifically, e.g., 1 to 4,000 Pa. The partial pressure of the DEA gas within the process chamber 201 is set to fall within a range of, e.g., 0.01 to 4,950 Pa. The time during which the DEA gas is supplied to the wafer 200, namely the gas supply time (irradiation time), is set to fall within a range of, e.g., 1 to 200 seconds, specifically, e.g., 1 to 120 seconds, or more specifically, e.g., 1 to 60 seconds. Other processing conditions may be the same as, e.g., the processing conditions of step 1 of the film forming sequence illustrated in FIG. 4A.

By performing step 7, it is possible to cause the sixth layer (boron-containing layer) formed on the second film to react with the DEA gas, thereby modifying the sixth layer. At this time, the N component and the C component contained in the DEA gas are added to the sixth layer, whereby a seventh layer containing B, C and N, namely a BCN layer, is formed on the second film, i.e., the BCN film. The seventh layer becomes a borazine-ring-skeleton-free layer.

During the formation of the seventh layer, the Cl contained in the sixth layer or the H contained in the DEA gas forms a gaseous substance containing at least Cl or H in the course of the modification reaction of the sixth layer using the DEA gas. The gaseous substance thus formed is exhausted from the interior of the process chamber 201. That is to say, the impurities such as Cl and the like contained in the sixth layer are extracted or desorbed from the sixth layer and are eventually separated from the sixth layer. Thus, the seventh layer becomes a layer which is smaller in the amount of impurities such as Cl and the like than the sixth layer.

After the seventh layer is formed, the valve 243e is closed to stop the supply of the DEA gas. Then, the unreacted DEA gas, the DEA gas contributed to the formation of the seventh layer, or the reaction byproduct, which remains within the process chamber 201, is removed from the interior of the process chamber 201 by the same processing procedures as used at step 1. At this time, similar to step 1, the gas or the like which remains within the process chamber 201 may not be completely removed.

Then, similar to the second film forming process of the film forming sequence shown in FIG. 4A, the third set including steps 6 and 7 is performed a predetermined number of times ($m_3$ times), whereby a third film, namely a BCN film having a predetermined composition and a predetermined thickness, can be formed on the second film, i.e., the BCN film. At this time, the number of times the third set is performed is controlled such that the thickness of the third film becomes, e.g., 0.1 nm or more and 5 nm or less, specifically, e.g., 0.1 nm or more and 1 nm or less. As in the first film forming process and the second film forming process, the third set may be repeated a plurality of times within a range of, e.g., one or more times and 50 times or less, specifically, e.g., one or more times and 10 times or less.

At this time, the composition ratio of the third film is controlled such that the B/N ratio in the third film differs from the B/N ratio in the first film and the B/N ratio in the second film. The control of the composition ratio of the third film can be performed in the same or similar manner as the control of the composition ratio of the second film. That is to say, by controlling the processing conditions of the respective steps such as the internal pressure of the process chamber 201, the gas supply time, the gas supply flow rate and the like, it is possible to adjust the ratio of the respective element components, i.e., the B component, the C component and the N component, namely the B concentration, the C concentration and the N concentration in the BCN layer formed at step 7. This makes it possible to control the composition ratio of the third film. The B/C ratio in the third film can be controlled in the aforementioned manner. Moreover, the C/N ratio in the third film can be controlled by appropriately selecting the kind of gases used at step 7. That is to say, if the TEA gas (C/N ratio=6/1) is used at step 3 and if the DEA gas (C/N ratio=4/1) is used at step 7, it is possible to make the C/N ratio in the third film smaller than the C/N ratio in the first film.

Thereafter, a cycle including the first film forming process, the second film forming process and the third film forming process is performed a predetermined number of times (n times), whereby a laminated film (nano-laminated film) composed of the first film, the second film and the third film laminated one above another at a nanoscale thickness can be formed on the wafer 200.

According to this modification, there are provided the same or similar effects as achieved in the film forming sequence shown in FIG. 4A. In addition, according to this modification in which three films are laminated in one cycle, as compared with the film forming sequence shown in FIG. 4A in which two films are laminated in one cycle, it is possible to further improve the controllability of the composition ratio of the finally-formed SiBCN film. That is to say, by controlling the B/N ratio, the B/C ratio and the C/N ratio of the second film in the aforementioned manner and by controlling the B/N ratio, the B/C ratio and the C/N ratio of the third film in the aforementioned manner, it is possible to further improve the controllability of the composition ratio of the finally-formed SiBCN film. It is also possible to precisely and finely adjust at least one of the B concentration, the C concentration and the N concentration in the finally-formed SiBCN film.

(Modifications 6 to 18)

Modification 5 and modifications 1 to 4 may be arbitrarily combined.

For example, a laminated film may be formed on the wafer 200 by performing, a predetermined number of times, a cycle of forming a borazine-ring-skeleton-free SiBCN film through the use of the HCDS gas, the $BCl_3$ gas and the TEA gas, forming a borazine-ring-skeleton-containing BCN film through the use of the $BCl_3$ gas and the TMB gas, forming a borazine-ring-skeleton-free BCN film through the use of the $BCl_3$ gas and the TEA gas, and laminating the films in the named order at a nanoscale thickness (Modification 6).

For example, a laminated film may be formed on the wafer 200 by performing, a predetermined number of times, a cycle of forming a borazine-ring-skeleton-free SiBCN film through the use of the HCDS gas, the BCl$_3$ gas and the TEA gas, forming a borazine-ring-skeleton-free BCN film through the use of the BCl$_3$ gas and the TEA gas, forming a borazine-ring-skeleton-containing BCN film through the use of the BCl$_3$ gas and the TMB gas, and laminating the films in the named order at a nanoscale thickness (Modification 7).

Figure 6B:
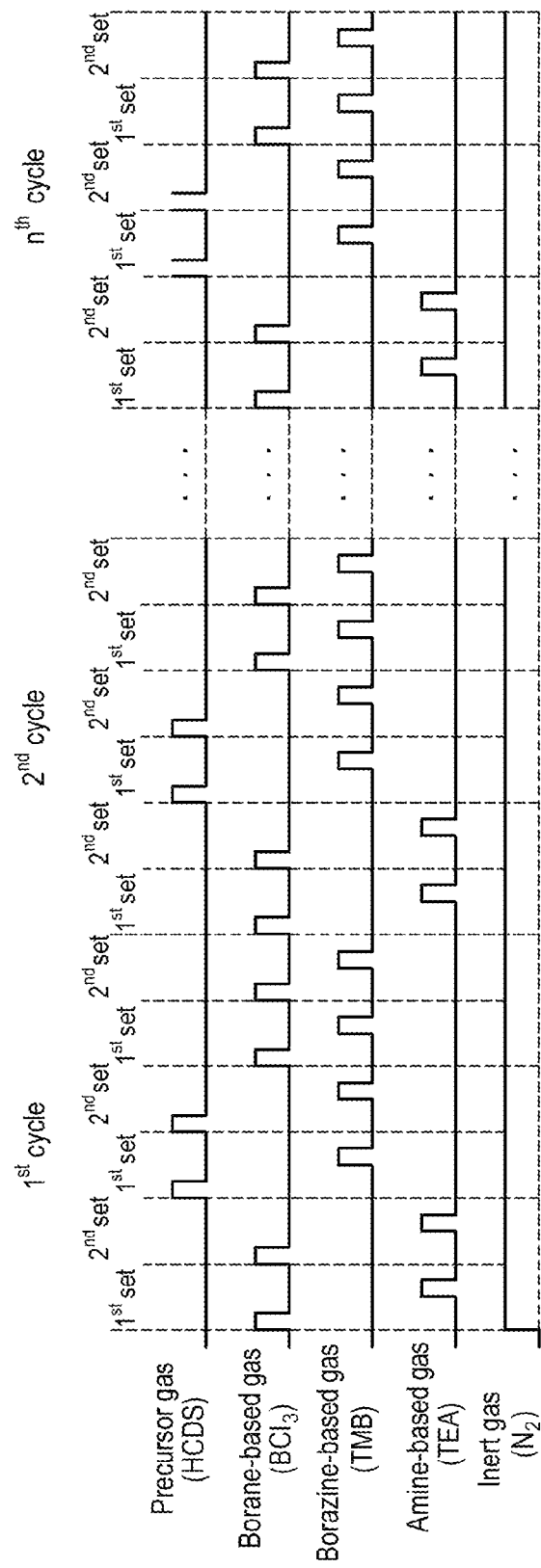

For example, as shown in FIG. 6B, a laminated film may be formed on the wafer 200 by performing, a predetermined number of times, a cycle of forming a borazine-ring-skeleton-free BCN film through the use of the BCl$_3$ gas and the TEA gas, forming a borazine-ring-skeleton-containing SiBCN film through the use of the HCDS gas and the TMB gas, forming a borazine-ring-skeleton-containing BCN film through the use of the BCl$_3$ gas and the TMB gas, and laminating the films in the named order at a nanoscale thickness (Modification 8).

For example, a laminated film may be formed on the wafer 200 by performing, a predetermined number of times, a cycle of forming a borazine-ring-skeleton-free BCN film through the use of the BCl$_3$ gas and the TEA gas, forming a borazine-ring-skeleton-containing BCN film through the use of the BCl$_3$ gas and the TMB gas, forming a borazine-ring-skeleton-containing SiBCN film through the use of the HCDS gas and the TMB gas, and laminating the films in the named order at a nanoscale thickness (Modification 9).

Figure 7:
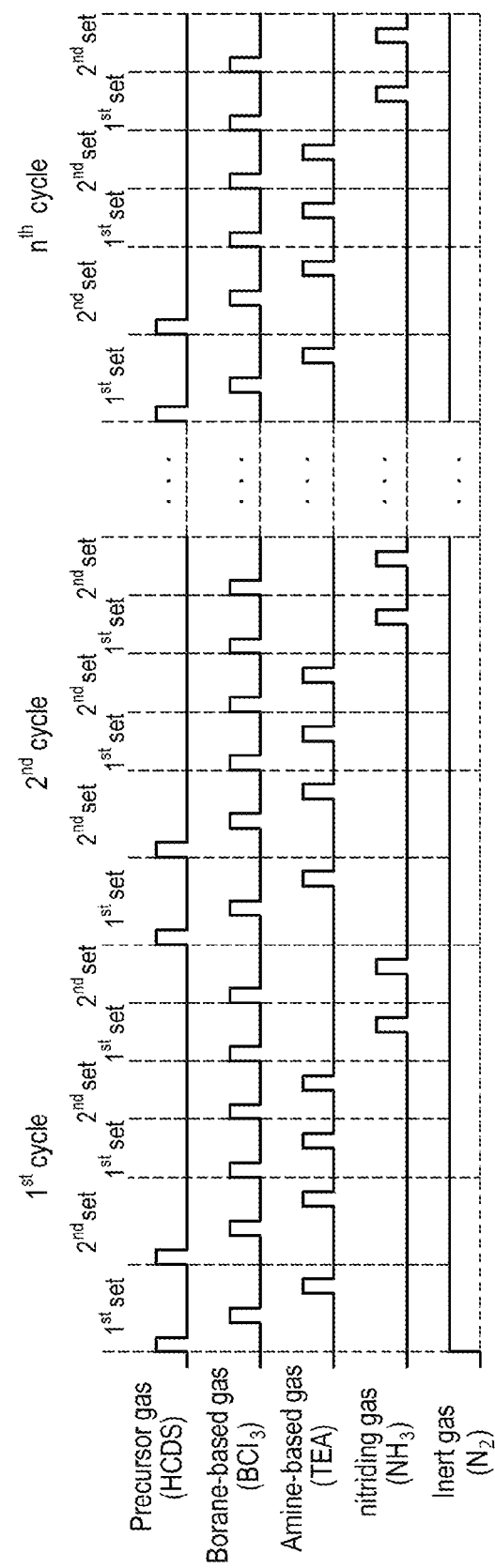
FIG. 7 is a view showing a tenth modification of the gas supply timing in the film forming sequence.

For example, as shown in FIG. 7, a laminated film may be formed on the wafer 200 by performing, a predetermined number of times, a cycle of forming a borazine-ring-skeleton-free SiBCN film through the use of the HCDS gas, the BCl$_3$ gas and the TEA gas, forming a borazine-ring-skeleton-free BCN film through the use of the BCl$_3$ gas and the TEA gas, forming a borazine-ring-skeleton-free BN film through the use of the BCl$_3$ gas and the NH$_3$ gas, and laminating the films in the named order at a nanoscale thickness (Modification 10).

For example, a laminated film may be formed on the wafer 200 by performing, a predetermined number of times, a cycle of forming a borazine-ring-skeleton-free SiBCN film through the use of the HCDS gas, the BCl$_3$ gas and the TEA gas, forming a borazine-ring-skeleton-containing BCN film through the use of the BCl$_3$ gas and the TMB gas, forming a borazine-ring-skeleton-free BN film through the use of the BCl$_3$ gas and the NH$_3$ gas, and laminating the films in the named order at a nanoscale thickness (Modification 11).

For example, a laminated film may be formed on the wafer 200 by performing, a predetermined number of times, a cycle of forming a borazine-ring-skeleton-free SiBCN film through the use of the HCDS gas, the BCl$_3$ gas and the TEA gas, forming a borazine-ring-skeleton-free BN film through the use of the BCl$_3$ gas and the NH$_3$ gas, forming a borazine-ring-skeleton-containing BCN film through the use of the BCl$_3$ gas and the TMB gas, and laminating the films in the named order at a nanoscale thickness (Modification 12).

Figure 8:
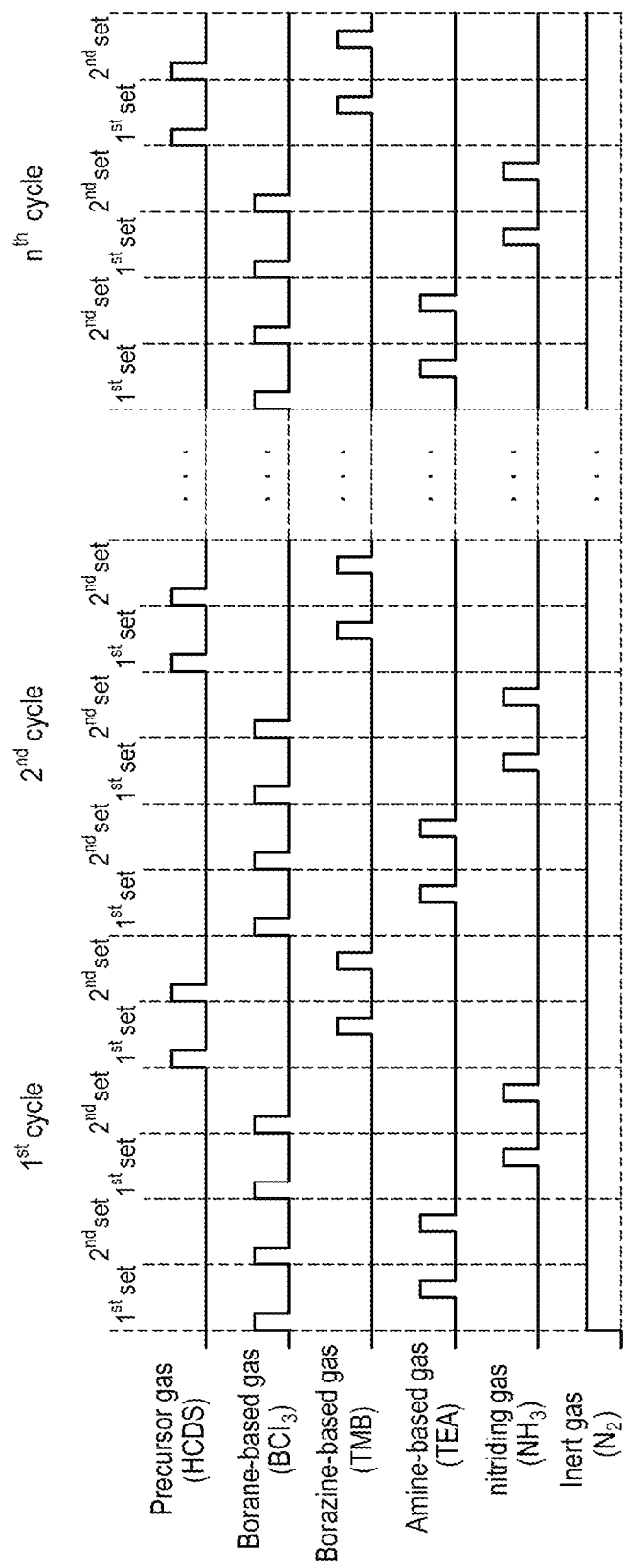
FIG. 8 is a view showing a thirteenth modification of the gas supply timing in the film forming sequence.

For example, as shown in FIG. 8, a laminated film may be formed on the wafer 200 by performing, a predetermined number of times, a cycle of forming a borazine-ring-skeleton-free BCN film through the use of the BCl$_3$ gas and the TEA gas, forming a borazine-ring-skeleton-free BN film through the use of the BCl$_3$ gas and the NH$_3$ gas, forming a borazine-ring-skeleton-containing SiBCN film through the use of the HCDS gas and the TMB gas, and laminating the films in the named order at a nanoscale thickness (Modification 13).

For example, a laminated film may be formed on the wafer 200 by performing, a predetermined number of times, a cycle of forming a borazine-ring-skeleton-free BN film through the use of the BCl$_3$ gas and the NH$_3$ gas, forming a borazine-ring-skeleton-free BCN film through the use of the BCl$_3$ gas and the TEA gas, forming a borazine-ring-skeleton-containing SiBCN film through the use of the HCDS gas and the TMB gas, and laminating the films in the named order at a nanoscale thickness (Modification 14).

For example, a laminated film may be formed on the wafer 200 by performing, a predetermined number of times, a cycle of forming a borazine-ring-skeleton-free BN film through the use of the BCl$_3$ gas and the NH$_3$ gas, forming a borazine-ring-skeleton-containing BCN film through the use of the BCl$_3$ gas and the TMB gas, forming a borazine-ring-skeleton-containing SiBCN film through the use of the HCDS gas and the TMB gas, and laminating the films in the named order at a nanoscale thickness (Modification 15).

Figure 9:
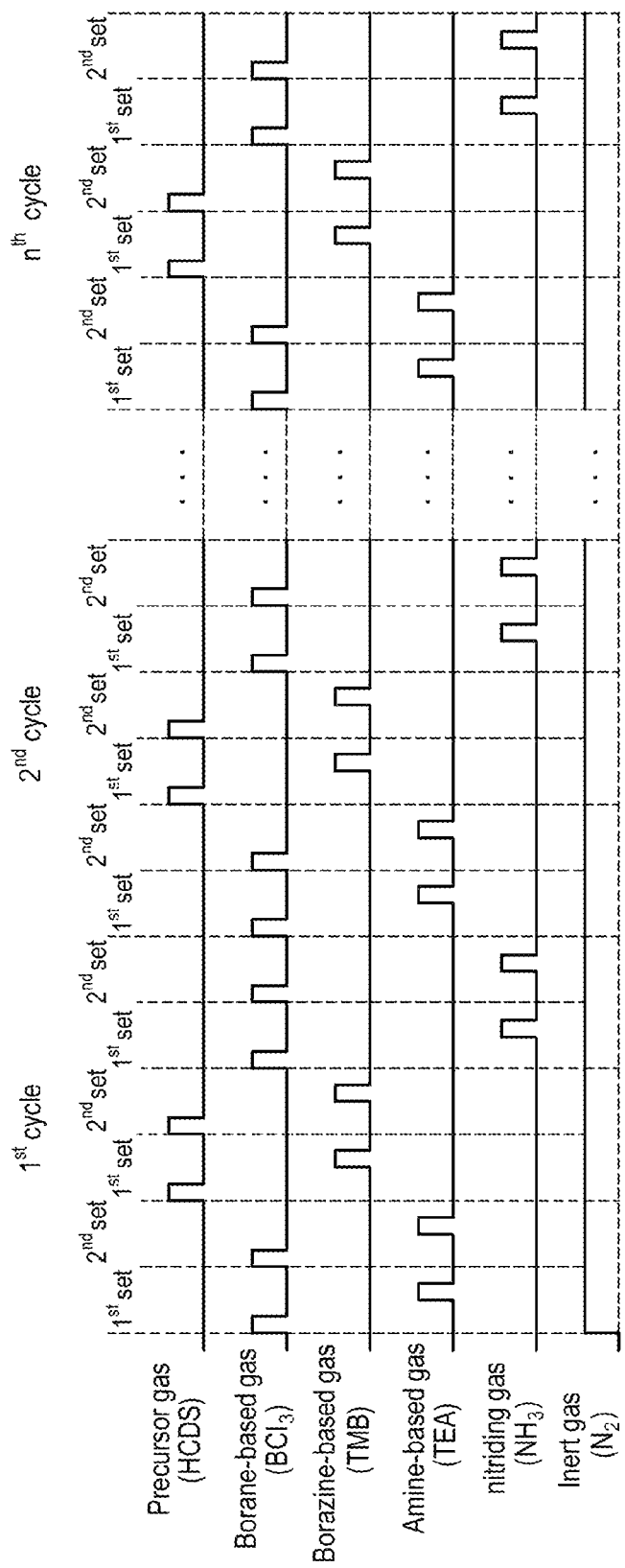
FIG. 9 is a view showing a sixteenth modification of the gas supply timing in the film forming sequence.

For example, as shown in FIG. 9, a laminated film may be formed on the wafer 200 by performing, a predetermined number of times, a cycle of forming a borazine-ring-skeleton-free BCN film through the use of the BCl$_3$ gas and the TEA gas, forming a borazine-ring-skeleton-containing SiBCN film through the use of the HCDS gas and the TMB gas, forming a borazine-ring-skeleton-free BN film through the use of the BCl$_3$ gas and the NH$_3$ gas, and laminating the films in the named order at a nanoscale thickness (Modification 16).

For example, a laminated film may be formed on the wafer 200 by performing, a predetermined number of times, a cycle of forming a borazine-ring-skeleton-free BN film through the use of the BCl$_3$ gas and the NH$_3$ gas, forming a borazine-ring-skeleton-containing SiBCN film through the use of the HCDS gas and the TMB gas, forming a borazine-ring-skeleton-free BCN film through the use of the BCl$_3$ gas and the TEA gas, and laminating the films in the named order at a nanoscale thickness (Modification 17).

For example, a laminated film may be formed on the wafer 200 by performing, a predetermined number of times, a cycle of forming a borazine-ring-skeleton-free BN film through the use of the BCl$_3$ gas and the NH$_3$ gas, forming a borazine-ring-skeleton-containing SiBCN film through the use of the HCDS gas and the TMB gas, forming a borazine-ring-skeleton-containing BCN film through the use of the BCl$_3$ gas and the TMB gas, and laminating the films in the named order at a nanoscale thickness (Modification 18).

In these modifications, the formation of the respective films (the first film, the second film and the third film) constituting the laminated film is performed by, e.g., the processing procedures and the processing conditions described in the film forming sequence shown in FIG. 4A or described in modifications 1 to 5. These modifications provide the same or similar effects as achieved in the film forming sequence shown in FIG. 4A or in modifications 1 to 5. Among modifications 6 to 18, modifications 6, 10, 11, 16 and 17 in which the uppermost portion of the laminated film is formed of a borazine-ring-skeleton-free film may be preferred in that the surface roughness of the laminated film can be more easily increased in modifications 6, 10, 11, 16 and 17 than in the remaining modifications.

(Modifications 19 to 22)

Figure 10:
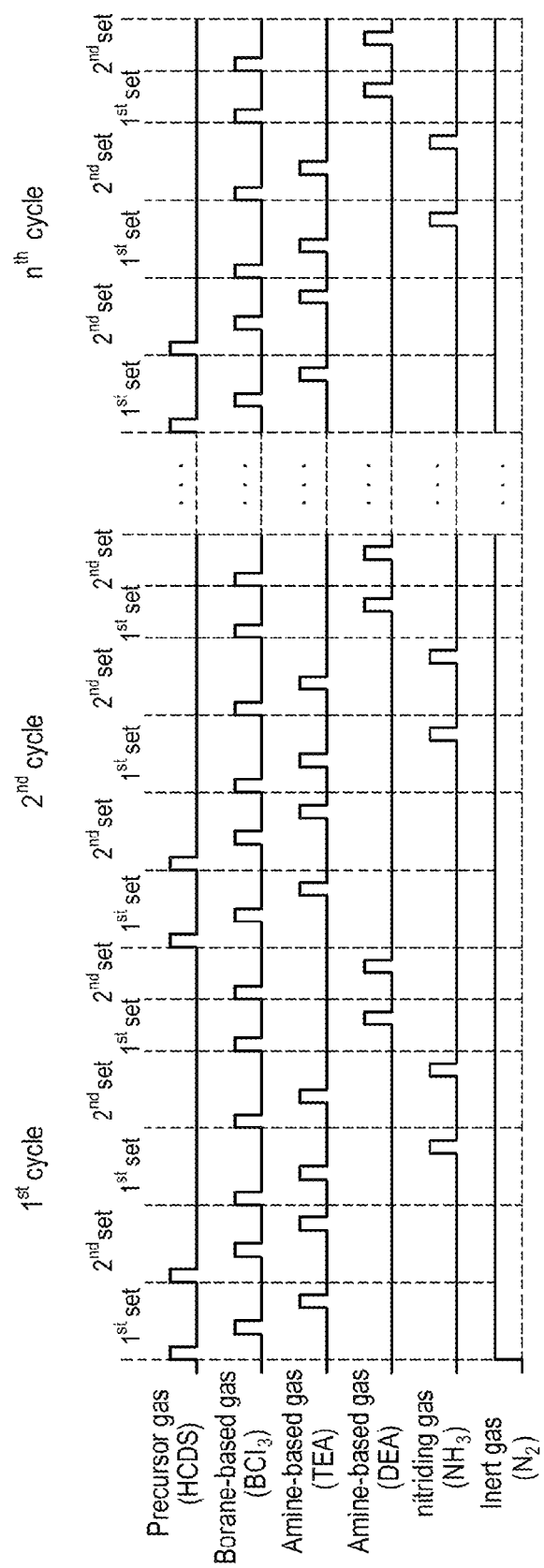
FIG. 10 is a view showing a twentieth modification of the gas supply timing in the film forming sequence.

In the film forming sequence shown in FIG. 4A or in the respective modifications described above, when forming the respective films that constitute the laminated film, the step of supplying the nitrogen-containing gas such as the NH$_3$ gas or the like may be performed after, e.g., the step of supplying the BCl$_3$ gas and the step of supplying the TEA gas. For example, the NH$_3$ gas may be supplied to the SiBCN layer formed using the HCDS gas, the BCl$_3$ gas and the TEA gas (Modification 19). As another example, the NH$_3$ gas may be supplied to the BCN layer formed using the BCl$_3$ gas and the TEA gas (Modification 20). FIG. 10 shows an example of modification 20 in which, when forming the second film in modification 5 shown in FIG. 6A, the step of supplying the NH$_3$ gas is performed after the step of supplying the BCl$_3$ gas and the step of supplying the TEA gas.

In the film forming sequence shown in FIG. 4A or in the respective modifications described above, when forming the respective films that constitute the laminated film, the step of supplying the nitrogen-containing gas such as the NH$_3$ gas or the like may be performed after, e.g., the step of supplying the BCl$_3$ gas and the step of supplying the TMB gas. That is to say, the NH$_3$ gas may be supplied to the borazine-ring-skeleton-containing BCN layer formed using the BCl$_3$ gas and the TMB gas (Modification 21).

Figure 11:
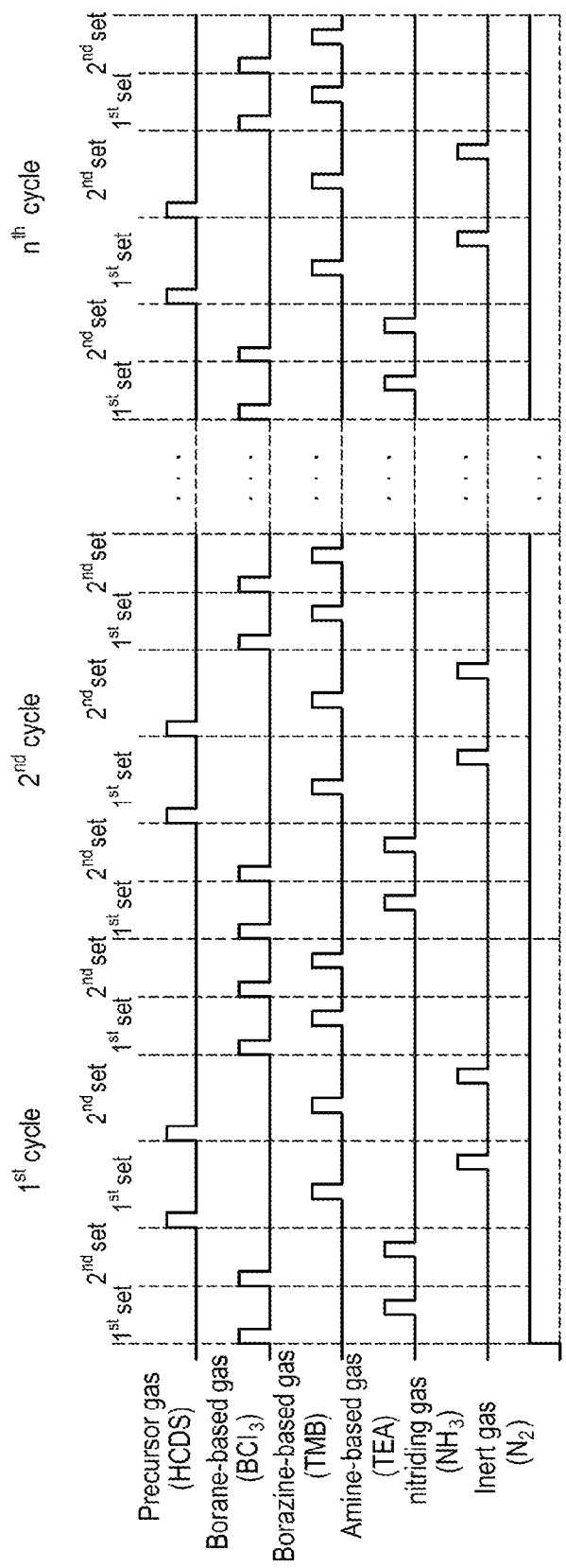
FIG. 11 is a view showing a twenty second modification of the gas supply timing in the film forming sequence.

In the film forming sequence shown in FIG. 4A or in the respective modifications described above, when forming the first film, the step of supplying the nitrogen-containing gas such as the NH$_3$ gas or the like may be performed after, e.g., the step of supplying the HCDS gas and the step of supplying the TMB gas. That is to say, the NH$_3$ gas may be supplied to the borazine-ring-skeleton-containing SiBCN layer formed using the HCDS gas and the TMB gas (Modification 22). FIG. 11 shows an example of modification 22 in which, when forming the first film in modification 8 shown in FIG. 6B, the step of supplying the NH$_3$ gas is performed after the step of supplying the HCDS gas and the step of supplying the TMB gas.

In any of the aforementioned modifications, the step of supplying the NH$_3$ gas is performed by, e.g., the same or similar processing procedures and processing conditions as those of step 5 of modification 3 shown in FIG. 5A. As the nitrogen-containing gas, it may be possible to use not only the NH$_3$ gas but also the aforementioned hydrogen nitride-based gas.

In modifications 19 and 22, the NH$_3$ gas is supplied to the SiBCN layer formed using the HCDS gas, the BCl$_3$ gas and the TEA gas or the borazine-ring-skeleton-containing SiBCN layer formed using the HCDS gas and the TMB gas (either of which will be simply referred to as a SiBCN layer). This makes it possible to cause the SiBCN layer to react with the NH$_3$ gas, thereby nitriding (modifying) at least a portion of the SiBCN layer. By virtue of the nitriding, nitrogen is further added to the SiBCN layer, whereby at least some of the C atoms contained in the SiBCN layer can be desorbed from the SiBCN layer. At this time, for example, by increasing the internal pressure of the process chamber 201 and eventually increasing the nitriding power, it is possible to desorb most of the C atoms contained in the SiBCN layer such that the C atoms exist at an impurity level. It is also possible to substantially extinguish the C atoms contained in the SiBCN layer. Thus, the SiBCN layer is modified to an N-rich (C-poor) SiBCN layer or a SiBN layer. According to modifications 19 and 22, an N-rich (C-poor) SiBCN film or a SiBN film is formed as a first film.

In modifications 20 and 21, the NH$_3$ gas is supplied to the BCN layer formed using the BCl$_3$ gas and the TEA gas or the borazine-ring-skeleton-containing BCN layer formed using the BCl$_3$ gas and the TMB gas (either of which will be simply referred to as a BCN layer). This makes it possible to cause the BCN layer to react with the NH$_3$ gas, thereby nitriding (modifying) at least a portion of the BCN layer. By virtue of the nitriding, nitrogen is further added to the BCN layer, whereby at least some of the C atoms contained in the BCN layer can be desorbed from the BCN layer. At this time, for example, by increasing the internal pressure of the process chamber 201 and eventually increasing the nitriding power, it is possible to desorb most of the C atoms contained in the BCN layer such that the C atoms exist at an impurity level. It is also possible to substantially extinguish the C atoms contained in the BCN layer. Thus, the BCN layer is modified to an N-rich (C-poor) BCN layer or a BN layer. According to modifications 20 and 21, an N-rich (C-poor) BCN film or a BN film is formed as a second film or a third film.

According to these modifications, it is possible to further increase the controllability of the composition of the finally-formed laminated film. For example, by forming the N-rich (C-poor) SiBCN film as the first film and by forming the N-rich (C-poor) BCN film as the second film (or the third film), it is possible to have the finally-formed laminated film become an N-rich (C-poor) SiBCN film. As another example, by forming the SiBN film as the first film and by forming the BN film as the second film (or the third film), it is possible to have the finally-formed laminated film become a SiBN film. According to these modifications, by supplying the NH$_3$ gas under the aforementioned conditions, it is possible to desorb the impurities such as Cl and the like from the respective films which constitute the laminated film. This makes it possible to reduce the impurity concentration of the finally-formed SiBCN film or the finally-formed SiBN film, thereby increasing the HF resistance of the film.

(Modification 23)

In the film forming sequence shown in FIG. 4A or in the respective modifications described above, a step of supplying a carbon-containing gas such as a C$_3$H$_6$ gas or the like and a step of supplying a nitrogen-containing gas such as a NH$_3$ gas or the like may be performed in place of the step of supplying the N- and C-containing gas such as the TEA gas or the like. FIG. 12 shows an example in which, when forming the second film, i.e., the BCN film, in modification 2 shown in FIG. 4B, a step of supplying a C$_3$H$_6$ gas and a step of supplying a NH$_3$ gas are performed in the named order without performing the step of supplying the TEA gas.

At the step of supplying the C$_3$H$_6$ gas, for example, the opening/closing control of the valves 243g and 243h to 243k is performed in the same or similar manner as the opening/closing control of the valves 243a and 243h to 243k performed at Step 1. The supply flow rate of the C$_3$H$_6$ gas controlled by the MFC 241g is set to fall within a range of, e.g., 100 to 10,000 sccm. The internal pressure of the process chamber 201 is set to fall within a range of, e.g., 1 to 5,000 Pa, specifically, e.g., 1 to 4,000 Pa. The partial pressure of the C$_3$H$_6$ gas within the process chamber 201 is set to fall within a range of, e.g., 0.01 to 4,950 Pa. The time during which the C$_3$H$_6$ gas is supplied to the wafer 200, namely the gas supply time (irradiation time), is set to fall within a range of, e.g., 1 to 200 seconds, specifically, e.g., 1 to 120 seconds, or more specifically, e.g., 1 to 60 seconds. Other processing conditions may be the same as, e.g., the processing conditions of step 1 of the film forming sequence illustrated in FIG. 4A. As the carbon-containing gas, it may be possible to use not only the C$_3$H$_6$ gas but also, e.g., a hydrocarbon-based gas such as an acetylene (C$_2$H$_2$) gas, an ethylene (C$_2$H$_4$) gas or the like.

The step of supplying the NH$_3$ gas, which is performed after supplying the C$_3$H$_6$ gas, may be performed by, e.g., the same processing procedures and processing conditions as those of step 5 of modification 3 shown in FIG. 5A. As the nitrogen-containing gas, it may be possible to use not only the NH$_3$ gas but also the aforementioned hydrogen nitride-based gas.

According to this modification, there are provided the same or similar effects as achieved in the film forming sequence shown in FIG. 4A or achieved in the respective modifications described above. In addition, according to this modification, the step of supplying the C$_3$H$_6$ gas is performed independently of the step of supplying the NH$_3$ gas. It is therefore possible to further improve the controllability of the composition ratio of the finally-formed SiBCN film. That is to say, instead of the supply of the TEA gas acting as an N source and a C source, the supply of the C$_3$H$_6$ gas acting as a C source (not acting as an N source) and the supply of the NH$_3$ gas acting as an N source (not acting as a C source) are performed independently of each other such that the supply timings thereof should not overlap with each other. It is therefore possible to freely set the processing conditions of the step. As a result, it becomes easy to increase the C concentration in the finally-formed SiBCN film while suppressing an increase of the N concentration in the finally-formed SiBCN film. In order to reliably perform the reaction of the NH$_3$ gas with the B-containing layer having a surface on which a C$_3$H$_6$ gas is adsorbed, namely the nitriding reaction of the NH$_3$ gas with the B-containing layer having a surface on which a C$_3$H$_6$ gas is adsorbed, the step of supplying the C$_3$H$_6$ gas may be finished before the reaction of adsorption of the C$_3$H$_6$ gas onto the surface of the B-containing layer is saturated, namely before the adsorption layer (chemical adsorption layer) of the C$_3$H$_6$ gas formed on the surface of the B-containing layer becomes a continuous layer (while the adsorption layer is maintained as a discontinuous layer).

(Modification 24)

In the film forming sequence shown in FIG. 4A or in the respective modifications described above, the step of supplying the C$_3$H$_6$ gas may be performed simultaneously with at least one of the step of supplying the BCl$_3$ gas, the step of supplying the TMB gas, the step of supplying the TEA gas, the step of supplying the HCDS gas and the step of supplying the NH$_3$ gas. FIG. 13 shows an example in which, in the film forming sequence shown in FIG. 4A, the step of supplying the C$_3$H$_6$ gas is performed simultaneously with each of steps 3 and 5 of supplying the TEA gas.

The step of supplying the C$_3$H$_6$ gas may be performed by, e.g., the same processing procedures and processing conditions as those of the C$_3$H$_6$ gas supply step of modification 22. As the carbon-containing gas, it may be possible to use not only the C$_3$H$_6$ gas but also the aforementioned hydrocarbon-based gas.

According to this modification, there are provided the same or similar effects as achieved in the film forming sequence shown in FIG. 4A or achieved in the respective modifications described above. In addition, according to this modification, it is possible to add the C component contained in the C$_3$H$_6$ gas to the finally-formed SiBCN film. This makes it possible to further increase the controllability of the composition ratio of the finally-formed SiBCN film. However, the C$_3$H$_6$ gas may be supplied simultaneously with the TMB gas, the BCl$_3$ gas, the TEA gas or the NH$_3$ gas rather than the HCDS gas. This is because, by doing so, it becomes possible to avoid the gas-phase reaction of the C$_3$H$_6$ gas within the process chamber 201 and to suppress generation of particles within the process chamber 201. Furthermore, the C$_3$H$_6$ gas may be supplied simultaneously with the TMB gas or the TEA gas rather than the BCl$_3$ gas or the NH$_3$ gas. This is because, by doing so, it becomes possible to further increase the controllability of the composition ratio of the film thus formed.

Other Embodiments of the Present Disclosure

While one embodiment of the present disclosure has been described above, the present disclosure is not limited to the aforementioned embodiment but may be differently modified without departing from the spirit of the present disclosure.

For example, in the aforementioned embodiment, there has been described an example in which, when forming the first film, a boron-containing gas is supplied after the supply of a precursor gas. The present disclosure is not limited to the aforementioned embodiment. The gas may be supplied in a reverse order. That is to say, when forming the first film, the precursor gas may be supplied after the supply of the boron-containing gas. By changing the gas supply order in this way, it becomes possible to change the quality or the composition ratio of the resultant film.

If the silicon-based insulating film formed by the methods of the embodiment or the modifications described above is used as a sidewall spacer, it is possible to provide a technique of forming a device which is small in leak current and superior in workability. If the aforementioned silicon-based insulating film is used as an etching stopper, it is possible to provide a technique of forming a device which is superior in workability. According to the embodiment or some of the modifications described above, it is possible to form a silicon-based insulating film having an ideal stoichiometric ratio without having to use plasma. Since the silicon-based insulating film can be formed without having to use plasma, it is possible to adapt to a process for forming, e.g., a SADP film of a DPT, in which plasma damage is about a concern.

In the aforementioned embodiment, there has been described an example in which the silicon-based insulating film (the SiBCN film or the SiBN film) containing Si as a semiconductor element is formed as a borocarbonitride film or a boronitride film containing a predetermined element. The present disclosure is not limited to the aforementioned form but may be applied to, e.g., a case where a metal-based thin film containing a metal element such as titanium (Ti), zirconium (Zr), hafnium (Hf), tantalum (Ta), aluminum (Al), molybdenum (Mo) or the like is formed.

That is to say, the present disclosure may be suitably applied to, e.g., a case where a metal borocarbonitride film or a metal boronitride film, such as a TiBCN film, a TiBN film, a ZrBCN film, a ZrBN film, a HfBCN film, a HfBN film, a TaBCN film, a TaBN film, an AlBCN film, an AlBN film, a MoBCN film, a MoBN film or the like, is formed. In this case, instead of the Si-containing precursor gas used in the aforementioned embodiment, a precursor gas containing a metal element may be used as the precursor gas. Film formation can be performed by the same film forming sequence as used in the aforementioned embodiment.

In the case of forming the TiBCN film or the TiBN film, a precursor gas containing Ti and a halogen element may be used as a Ti-containing precursor gas. As the precursor gas containing Ti and a halogen element, it may be possible to use, e.g., a precursor gas containing Ti and a chloro group, such as a titanium tetrachloride (TiCl$_4$) gas or the like, or a precursor gas containing Ti and a fluoro group, such as a titanium tetrafluoride (TiF$_4$) gas or the like. The same gases as used in the aforementioned embodiment may be used as the boron-containing gas such as a borane-based gas, a borazine-based gas or the like, the N- and C-containing gas, the nitrogen-containing gas and the carbon-containing gas.

The processing conditions used in this case may be the same as, e.g., those of the aforementioned embodiment.

In the case of forming the ZrBCN film or the ZrBN film, a precursor gas containing Zr and a halogen element may be used as a Zr-containing precursor gas. As the precursor gas containing Zr and a halogen element, it may be possible to use, e.g., a precursor gas containing Zr and a chloro group, such as a zirconium tetrachloride ($ZrCl_4$) gas or the like, or a precursor gas containing Zr and a fluoro group, such as a zirconium tetrafluoride ($ZrF_4$) gas or the like. The same gases as used in the aforementioned embodiment may be used as the boron-containing gas such as a borane-based gas, a borazine-based gas or the like, the N- and C-containing gas, the nitrogen-containing gas and the carbon-containing gas. The processing conditions used in this case may be the same as, e.g., those of the aforementioned embodiment.

In the case of forming the HfBCN film or the HfBN film, a precursor gas containing Hf and a halogen element may be used as an Hf-containing precursor gas. As the precursor gas containing Hf and a halogen element, it may be possible to use, e.g., a precursor gas containing Hf and a chloro group, such as a hafnium tetrachloride ($HfCl_4$) gas or the like, or a precursor gas containing Hf and a fluoro group, such as a hafnium tetrafluoride ($HfF_4$) gas or the like. The same gases as used in the aforementioned embodiment may be used as the boron-containing gas such as a borane-based gas, a borazine-based gas or the like, the N- and C-containing gas, the nitrogen-containing gas and the carbon-containing gas. The processing conditions used in this case may be the same as, e.g., those of the aforementioned embodiment.

In the case of forming the TaBCN film or the TaBN film, a precursor gas containing Ta and a halogen element may be used as a Ta-containing precursor gas. As the precursor gas containing Ta and a halogen element, it may be possible to use, e.g., a precursor gas containing Ta and a chloro group, such as a tantalum pentachloride ($TaCl_5$) gas or the like, or a precursor gas containing Ta and a fluoro group, such as a tantalum pentafluoride ($TaF_5$) gas or the like. The same gases as used in the aforementioned embodiment may be used as the boron-containing gas such as a borane-based gas, a borazine-based gas or the like, the N- and C-containing gas, the nitrogen-containing gas and the carbon-containing gas. The processing conditions used in this case may be the same as, e.g., those of the aforementioned embodiment.

In the case of forming the AlBCN film or the AlBN film, a precursor gas containing Al and a halogen element may be used as an Al-containing precursor gas. As the precursor gas containing Al and a halogen element, it may be possible to use, e.g., a precursor gas containing Al and a chloro group, such as an aluminum trichloride ($AlCl_3$) gas or the like, or a precursor gas containing Al and a fluoro group, such as an aluminum trifluoride ($AlF_3$) gas or the like. The same gases as used in the aforementioned embodiment may be used as the boron-containing gas such as a borane-based gas, a borazine-based gas or the like, the N- and C-containing gas, the nitrogen-containing gas and the carbon-containing gas. The processing conditions used in this case may be the same as, e.g., those of the aforementioned embodiment.

In the case of forming the MoBCN film or the MoBN film, a precursor gas containing Mo and a halogen element may be used as a Mo-containing precursor gas. As the precursor gas containing Mo and a halogen element, it may be possible to use, e.g., a precursor gas containing Mo and a chloro group, such as a molybdenum pentachloride ($MoCl_5$) gas or the like, or a precursor gas containing Mo and a fluoro group, such as a molybdenum pentafluoride ($MoF_5$) gas or the like. The same gases as used in the aforementioned embodiment may be used as the boron-containing gas such as a borane-based gas, a borazine-based gas or the like, the N- and C-containing gas, the nitrogen-containing gas and the carbon-containing gas. The processing conditions used in this case may be the same as, e.g., those of the aforementioned embodiment.

That is to say, the present disclosure may be suitably applied to a case where a thin film containing a predetermined element such as a semiconductor element, a metal element or the like is formed.

A plurality of process recipes (e.g., programs describing process procedures and process conditions) used in forming these various kinds of films may be individually prepared according to the contents of substrate processing (e.g., the kind, composition ratio, quality and thickness of the film to be formed). In addition, at the start of the substrate processing, an appropriate process recipe may be properly selected from the process recipes according to the substrate processing contents. Specifically, the process recipes individually prepared according to the substrate processing contents may be stored (or installed) in advance in the memory device 121c of the substrate processing apparatus via a telecommunication line or a recording medium (e.g., the external memory device 123) storing the process recipes. Moreover, at the start of the substrate processing, the CPU 121a of the substrate processing apparatus may properly select an appropriate process recipe from the process recipes stored in the memory device 121c according to the substrate processing contents. This configuration enables a single substrate processing apparatus to form films having different composition ratios, qualities and thicknesses for general purposes and with enhanced reproducibility. In addition, this configuration can reduce an operator's operation burden (a burden borne by an operator when inputting process procedures and process conditions), thereby avoiding a manipulation error and quickly starting the substrate processing.

The process recipes are not limited to newly prepared ones but may be prepared by, for example, modifying the existing process recipes already installed in the substrate processing apparatus. In the case of modifying the process recipes, the modified process recipes may be installed in the substrate processing apparatus via a telecommunication line or a recording medium storing the process recipes. In addition, the existing process recipes already installed in the substrate processing apparatus may be directly modified by operating the input/output device 122 of the substrate processing apparatus.

In the aforementioned embodiment, there has been described an example in which thin films are formed using a batch type substrate processing apparatus capable of processing a plurality of substrates at a time. The present disclosure is not limited to the aforementioned embodiment but may be appropriately applied to, e.g., a case where thin films are formed using a single-wafer-type substrate processing apparatus capable of processing a single substrate or several substrates at a time. In addition, in the aforementioned embodiment, there has been described an example in which thin films are formed using a substrate processing apparatus provided with a hot-wall-type processing furnace. The present disclosure is not limited to the aforementioned embodiment but may be appropriately applied to a case where thin films are formed using a substrate processing apparatus provided with a cold-wall-type processing furnace. In these cases, the processing conditions may be the same as those of the aforementioned embodiment.

The embodiments and modifications described above may be appropriately combined with one another. In this case, the processing conditions may be the same as those of the aforementioned embodiments.

<Aspects of the Present Disclosure>

Hereinafter, some aspects of the present disclosure will be additionally stated as supplementary notes.

(Supplementary Note 1)

According to one aspect of the present disclosure, there is provided a method of manufacturing a semiconductor device and a substrate processing method, including forming a laminated film on a substrate by performing a cycle a first predetermined number of times (n times), the cycle including:

forming a first film which contains a predetermined element, boron, and nitrogen; and forming a second film which contains boron and nitrogen, a composition ratio of boron to nitrogen in the second film being different from that in the first film, wherein the first film and the second film are laminated to form the laminated film.

(Supplementary Note 2)

In the method of Supplementary Note 1, the cycle may further include forming a third film which contains boron and nitrogen, a composition ratio of boron to nitrogen in the third film being different from that in the first film and that in the second film, wherein the first film, the second film and the third film are laminated to form the laminated film on the substrate by performing the cycle the first predetermined number of times (n times).

(Supplementary Note 3)

In the method of Supplementary Note 1 or 2, forming the first film may include performing a first set a second predetermined number of times ($m_1$ times), the first set including:

supplying a precursor gas containing the predetermined element to the substrate;

supplying a boron-containing gas to the substrate; and supplying a nitrogen-containing gas or a nitrogen- and carbon-containing gas to the substrate.

(Supplementary Note 4)

In the method of Supplementary Note 1 or 2, forming the first film may include performing a first set a second predetermined number of times ($m_1$ times), the first set including:

supplying a precursor gas containing the predetermined element to the substrate;

supplying a boron-containing gas to the substrate;

supplying a nitrogen- and carbon-containing gas to the substrate; and supplying a nitrogen-containing gas to the substrate.

(Supplementary Note 5)

In the method of Supplementary Note 1 or 2, forming the first film may include performing a first set a second predetermined number of times ($m_1$ times), the first set including:

supplying a precursor gas containing the predetermined element to the substrate; and supplying a borazine-ring-skeleton-containing gas to the substrate.

(Supplementary Note 6)

In the method of Supplementary Note 5, the first set may further include supplying a nitrogen-containing gas to the substrate.

(Supplementary Note 7)

In the method of any one of Supplementary Notes 3 to 6, the first set may further include supplying a carbon-containing gas to the substrate.

For example, supplying the carbon-containing gas is performed prior to supplying the nitrogen-containing gas. As another example, supplying the carbon-containing gas is performed simultaneously with or non-simultaneously with supplying the nitrogen- and carbon-containing gas. As a further example, supplying the carbon-containing gas is performed simultaneously with or non-simultaneously with supplying the borazine-ring-skeleton-containing gas.

(Supplementary Note 8)

In the method of any one of Supplementary Notes 1 to 7, forming the second film (or the third film) may include performing a second set (or a third set) a third predetermined number of times ($m_2$ times (or $m_3$ times)), the second set (or the third set) including:

supplying a boron-containing gas to the substrate; and supplying a nitrogen-containing gas or a nitrogen- and carbon-containing gas to the substrate.

(Supplementary Note 9)

In the method of any one of Supplementary Notes 1 to 7, forming the second film (or the third film) may include performing a second set (or a third set) a third predetermined number of times ($m_2$ times (or $m_3$ times)), the second set (or the third set) including:

supplying a boron-containing gas to the substrate;

supplying a nitrogen- and carbon-containing gas to the substrate; and supplying a nitrogen-containing gas to the substrate.

(Supplementary Note 10)

In the method of any one of Supplementary Notes 1 to 7, forming the second film (or the third film) may include performing a second set (or a third set) a third predetermined number of times ($m_2$ times (or $m_3$ times)), the second set (or the third set) including:

supplying a boron-containing gas to the substrate; and supplying a borazine-ring-skeleton-containing gas to the substrate.

(Supplementary Note 11)

In the method of Supplementary Note 10, the second set (or the third set) may further include supplying a nitrogen-containing gas to the substrate.

(Supplementary Note 12)

In the method of any one of Supplementary Notes 8 to 11, the second set (or the third set) may further include supplying a carbon-containing gas to the substrate.

For example, supplying the carbon-containing gas is performed prior to supplying the nitrogen-containing gas.

As another example, supplying the carbon-containing gas is performed simultaneously with or non-simultaneously with supplying the nitrogen- and carbon-containing gas. As a further example, supplying the carbon-containing gas is performed simultaneously with or non-simultaneously with supplying the borazine-ring-skeleton-containing gas.

(Supplementary Note 13)

In the method of any one of Supplementary Notes 1 to 12, each of the first film and the second film (each of the first film, the second film and the third film) may have a thickness ranging from 0.1 nm to 5 nm.

(Supplementary Note 14)

In the method of any one of Supplementary Notes 1 to 13, each of the first set and the second set (each of the first set, the second set and the third set) may be performed one or more times and 50 times or less, specifically, one or more times and 10 times or less.

(Supplementary Note 15)

In the method of any one of Supplementary Notes 1 to 14, the laminated film may be a nano-laminated film composed of the first film and the second film (the first film, the second film and the third film) which are laminated at a nanoscale thickness.

(Supplementary Note 16)

In the method of any one of Supplementary Notes 1 to 15, in the act of performing the cycle, an initially-formed layer may not contain a borazine ring skeleton. That is to say, the lowermost portion of the laminated film is configured by a borazine-ring-skeleton-free film.

(Supplementary Note 17)

In the method of any one of Supplementary Notes 1 to 16, in the act of performing the cycle, a finally-formed layer may not contain a borazine ring skeleton. That is to say, the uppermost portion of the laminated film is configured by a borazine-ring-skeleton-free film.

(Supplementary Note 18)

According to another aspect of the present disclosure, there is provided a substrate processing apparatus, including:

a process chamber configured to accommodate a substrate;

a first gas supply system configured to supply a precursor gas containing a predetermined element to the substrate in the process chamber;

a second gas supply system configured to supply a boron-containing gas to the substrate in the process chamber;

a third gas supply system configured to supply a nitrogen-containing gas or a nitrogen- and carbon-containing gas to the substrate in the process chamber; and a control unit configured to control the first gas supply system, the second gas supply system, and the third gas supply system to form a laminated film on the substrate in the process chamber by performing a cycle a predetermined number of times (n times) within the process chamber, the cycle including: forming a first film which contains the predetermined element, boron and nitrogen; and forming a second film which contains boron and nitrogen, a composition ratio of boron to nitrogen in the second film being different from that in the first film, wherein the first film and the second film are laminated to form the laminated film.

(Supplementary Note 19)

According to a further aspect of the present disclosure, there is provided a non-transitory computer-readable recording medium storing a program that causes a computer to perform a process of forming a laminated film on a substrate by performing a cycle a predetermined number of times (n times), the cycle including:

forming a first film which contains a predetermined element, boron, and nitrogen; and forming a second film which contains boron and nitrogen, a composition ratio of boron to nitrogen in the second film being different from that in the first film, wherein the first film and the second film are laminated to form the laminated film.

According to the present disclosure, it is possible to enhance the controllability of a composition ratio and the controllability of a film property when forming a film.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a laminated film on a substrate by performing a cycle a first predetermined number of times, the cycle comprising:

forming a first film which contains a predetermined element, boron, and nitrogen; and forming a second film which contains boron and nitrogen, a composition ratio of boron to nitrogen in the second film being different from that in the first film, wherein the first film and the second film are laminated to form the laminated film, and wherein, in the act of performing the cycle, at least one of an initially-formed layer and a finally-formed layer does not contain a borazine ring skeleton.

2. The method of claim 1, wherein forming the first film includes performing a first set a second predetermined number of times, the first set comprising:

supplying a precursor gas containing the predetermined element to the substrate;

supplying a boron-containing gas to the substrate; and supplying a nitrogen-containing gas or a nitrogen- and carbon-containing gas to the substrate.

3. The method of claim 2, wherein the first set further comprises supplying a carbon-containing gas to the substrate.

4. The method of claim 2, wherein forming the second film includes performing a second set a third predetermined number of times, the second set comprising:

supplying a boron-containing gas to the substrate; and supplying a nitrogen-containing gas or a nitrogen- and carbon-containing gas to the substrate.

5. The method of claim 4, wherein the second set further comprises supplying a carbon-containing gas to the substrate.

6. The method of claim 2, wherein forming the second film includes performing a second set a third predetermined number of times, the second set comprising:

supplying a boron-containing gas to the substrate;

supplying a nitrogen- and carbon-containing gas to the substrate; and supplying a nitrogen-containing gas to the substrate.

7. The method of claim 2, wherein forming the second film includes performing a second set a third predetermined number of times, the second set comprising:

supplying a boron-containing gas to the substrate; and supplying a borazine-ring-skeleton-containing gas to the substrate.

8. The method of claim 1, wherein forming the first film includes performing a first set a second predetermined number of times, the first set comprising:

supplying a precursor gas containing the predetermined element to the substrate; and supplying a borazine-ring-skeleton-containing gas to the substrate.

9. The method of claim 1, wherein each of the first film and the second film has a thickness ranging from 0.1 nm to 5 nm.

10. The method of claim 1, wherein the laminated film is composed of the first film and the second film which are laminated at a nanoscale thickness.

11. A method of manufacturing a semiconductor device, comprising forming a laminated film on a substrate by performing a cycle a first predetermined number of times, the cycle comprising:
    forming a first film which contains a predetermined element, boron and nitrogen; and
    forming a second film which contains boron and nitrogen, a composition ratio of boron to nitrogen in the second film being different from that in the first film,
    wherein the first film and the second film are laminated to form the laminated film, and
    wherein forming the first film includes performing a first set a second predetermined number of times, the first set comprising:
        supplying a precursor gas containing the predetermined element to the substrate;
        supplying a boron-containing gas to the substrate;
        supplying a nitrogen- and carbon-containing gas to the substrate; and
        supplying a nitrogen-containing gas to the substrate.

12. A method of manufacturing a semiconductor device, comprising forming a laminated film on a substrate by performing a cycle a first predetermined number of times, the cycle comprising:
    forming a first film which contains a predetermined element, boron, and nitrogen; and
    forming a second film which contains boron and nitrogen, a composition ratio of boron to nitrogen in the second film being different from that in the first film,
    wherein the first film and the second film are laminated to form the laminated film,
    wherein forming the first film includes performing a first set a second predetermined number of times, the first set comprising:
        supplying a precursor gas containing the predetermined element to the substrate; and
        supplying a borazine-ring-skeleton-containing gas to the substrate, and
    wherein the first set further comprises supplying a nitrogen-containing gas to the substrate.

13. A method of manufacturing a semiconductor device, comprising forming a laminated film on a substrate by performing a cycle a first predetermined number of times, the cycle comprising:
    forming a first film which contains a predetermined element, boron, and nitrogen; and
    forming a second film which contains boron and nitrogen, a composition ratio of boron to nitrogen in the second film being different from that in the first film,
    wherein the first film and the second film are laminated to form the laminated film,
    wherein forming the first film includes performing a first set a second predetermined number of times, the first set comprising:
        supplying a precursor gas containing the predetermined element to the substrate;
        supplying a boron-containing gas to the substrate; and
        supplying a nitrogen-containing gas or a nitrogen- and carbon-containing gas to the substrate,
    wherein forming the second film includes performing a second set a third predetermined number of times, the second set comprising:
        supplying a boron-containing gas to the substrate; and
        supplying a borazine-ring-skeleton-containing gas to the substrate, and
    wherein the second set further comprises supplying a nitrogen-containing gas to the substrate.

14. A method of manufacturing a semiconductor device, comprising forming a laminated film on a substrate by performing a cycle a first predetermined number of times, the cycle comprising:
    forming a first film which contains a predetermined element, boron, and nitrogen; and
    forming a second film which contains boron and nitrogen, a composition ratio of boron to nitrogen in the second film being different from that in the first film,
    wherein the first film and the second film are laminated to form the laminated film,
    wherein the cycle further comprises forming a third film which contains boron and nitrogen, a composition ratio of boron to nitrogen in the third film being different from that in the first film and that in the second film,
    wherein the first film, the second film and the third film are laminated to form the laminated film on the substrate by performing the cycle the first predetermined number of times.

15. The method of claim 14, wherein forming the first film includes performing a first set a second predetermined number of times, the first set comprising:
    supplying a precursor gas containing the predetermined element to the substrate;
    supplying a boron-containing gas to the substrate; and
    supplying a nitrogen-containing gas or a nitrogen- and carbon-containing gas to the substrate,
    wherein forming the second film includes performing a second set a third predetermined number of times, the second set comprising:
    supplying a boron-containing gas to the substrate; and
    supplying a nitrogen-containing gas or a nitrogen- and carbon-containing gas to the substrate, and
    wherein forming the third film includes performing a third set a fourth predetermined number of times, the third set comprising:
    supplying a boron-containing gas to the substrate; and
    supplying a nitrogen-containing gas or a nitrogen- and carbon-containing gas to the substrate.

16. A non-transitory computer-readable recording medium storing a program that causes a computer to perform a process of forming a laminated film on a substrate by performing a cycle a predetermined number of times, the cycle comprising:
    forming a first film which contains a predetermined element, boron, and nitrogen; and
    forming a second film which contains boron and nitrogen, a composition ratio of boron to nitrogen in the second film being different from that in the first film,
    wherein the first film and the second film are laminated to form the laminated film, and
    wherein, in the act of performing the cycle, at least one of an initially-formed layer and a finally-formed layer does not contain a borazine ring skeleton.

* * * * *